(12) United States Patent
Ishiyama et al.

(10) Patent No.: US 12,470,131 B2
(45) Date of Patent: Nov. 11, 2025

(54) POWER CONVERSION DEVICE

(71) Applicant: Mitsubishi Electric Corporation, Tokyo (JP)

(72) Inventors: Hiroto Ishiyama, Tokyo (JP); Shogo Miki, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 253 days.

(21) Appl. No.: 18/333,725

(22) Filed: Jun. 13, 2023

(65) Prior Publication Data
US 2024/0186892 A1 Jun. 6, 2024

(30) Foreign Application Priority Data
Dec. 1, 2022 (JP) ................................ 2022-192611

(51) Int. Cl.
| | | |
|---|---|---|
| *H02M 3/04* | (2006.01) | |
| *B60R 16/03* | (2006.01) | |
| *H02M 3/00* | (2006.01) | |
| *H02M 3/28* | (2006.01) | |
| *H02M 7/00* | (2006.01) | |
| *H02M 7/48* | (2007.01) | |
| *H05K 7/20* | (2006.01) | |

(52) U.S. Cl.
CPC ............. *H02M 3/003* (2021.05); *B60R 16/03* (2013.01); *H02M 3/28* (2013.01); *H02M 7/003* (2013.01); *H02M 7/48* (2013.01); *H05K 7/20927* (2013.01)

(58) Field of Classification Search
CPC ........ H02M 3/003; H02M 3/28; H02M 7/003; H02M 7/48; H02M 3/00; H02M 3/02; H02M 3/04; B60R 16/03
See application file for complete search history.

(56) References Cited

U.S. PATENT DOCUMENTS

| | | | | |
|---|---|---|---|---|
| 5,872,711 | A | * | 2/1999 | Janko ..................... F28F 21/084 174/72 B |
| 6,954,368 | B1 | * | 10/2005 | Francoeur ............. H02M 7/003 361/763 |
| 7,042,745 | B1 | * | 5/2006 | Chen ..................... H02M 7/003 361/818 |
| 2011/0096496 | A1 | * | 4/2011 | Doo ....................... H01F 27/025 361/689 |
| 2022/0294360 | A1 | * | 9/2022 | Takahashi .......... H05K 7/14329 |

FOREIGN PATENT DOCUMENTS

JP 4418208 B2 2/2010

* cited by examiner

*Primary Examiner* — Gary L Laxton
(74) *Attorney, Agent, or Firm* — Sughrue Mion, PLLC

(57) ABSTRACT

This power conversion device includes: a power conversion portion including a power conversion circuit, and a first connection portion and a second connection portion; a first wiring portion connected to the first connection portion; a second wiring portion connected to the second connection portion; a first supply portion connected to the first wiring portion; a second supply portion connected to the second wiring portion; and a housing. The first connection portion is provided at an end on the first peripheral wall side, the second connection portion is provided at an end on the second peripheral wall side, the first supply portion is located adjacently to an end on the first peripheral wall side, the second supply portion is located adjacently to an end on the second peripheral wall side, the first wiring portion extends along the first peripheral wall, and the second wiring portion extends along the second peripheral wall.

17 Claims, 26 Drawing Sheets

POWER CONVERSION DEVICE

BACKGROUND

The present disclosure relates to a power conversion device.

Along with environmental restrictions and technology advancements concerning vehicles in recent years, electric automobiles or hybrid vehicles in various vehicle size classes are being developed and increasingly spreading. An electric vehicle using a motor as a drive source, as in a hybrid vehicle or an electric automobile, is provided with a plurality of power conversion devices. The power conversion device is a device for converting input current from DC to AC or from AC to DC, or converting input voltage to different voltage. Specific examples of such power conversion devices provided to electric vehicles include a charger for converting commercial AC power to DC power to charge a high-voltage battery, a DC-DC converter for converting DC power of a high-voltage battery to DC power having different voltage, and an inverter for converting DC power from a high-voltage battery to AC power for a motor.

The power conversion device is composed of a power conversion unit including a power conversion circuit for performing power conversion and a control circuit for controlling operation of the power conversion circuit, a housing storing them, and an interface (e.g., connector) which is connected to an external device and supplies power from the external device to the power conversion unit or from the power conversion unit to the external device. For electric vehicles, size reduction and cost reduction of the power conversion device are required, in view of requirements of ensuring a vehicle-compartment space and reducing the price.

A configuration in which the size of a DC-DC converter device as a power conversion device is reduced is disclosed (see, for example, Patent Document 1). In the configuration disclosed in Patent Document 1, the power conversion device is composed of a noise filter circuit unit, a power module having a switching element, a transformer, a reactor, a capacitor, and an input/output terminal electrically connected to the power module. With the input/output terminal electrically connected to the interface, power is supplied from the external device to the power module or from the power module to the external device.

Patent Document 1: Japanese Patent No. 4418208

In Patent Document 1, since the switching element is integrated with the power module, the size of the power conversion device can be reduced. However, the layout of various devices of an electric vehicle often differs depending on each vehicle type. Therefore, the interface (e.g., connector) of the power conversion device to be connected to the electric vehicle side and coolant inlet/outlet positions are changed depending on each vehicle type. In Patent Document 1, an input/output portion of each component is determined in advance. Therefore, if the interface position is changed, it is impossible to adapt thereto by only change of component layout, and it is necessary to change specifications of expensive large-sized components such as a power module, a transformer, and a choke coil, depending on each electric vehicle type. Thus, there is a problem that the cost of the components and therefore the cost of the power conversion device increase.

In the configuration in Patent Document 1, if the interface position is changed, it is possible to adapt thereto without changing specifications of expensive large-sized components, by using a wiring member for connecting the input/output portion and the interface. However, since the size of the wiring member increases, there is a problem that the cost of the wiring member increases. In addition, because of size increase of the wiring member, the heat-generation amount of the wiring member increases, so that an additional cooling member is needed. Thus, there is a problem that the cost of the power conversion device increases.

SUMMARY

Accordingly, an object of the present disclosure is to provide a cost-reduced power conversion device without changing specifications of expensive large-sized components.

A power conversion device according to the present disclosure includes: a power conversion portion including a power conversion circuit for converting power, and a first connection portion and a second connection portion electrically connecting the power conversion circuit to outside; a first wiring portion electrically connected to the first connection portion; a second wiring portion electrically connected to the second connection portion; a first supply portion electrically connected to the first wiring portion; a second supply portion electrically connected to the second wiring portion; and a housing storing the power conversion portion, the first wiring portion, and the second wiring portion, and having four peripheral walls in a rectangular tube shape. The four peripheral walls are a first peripheral wall, a second peripheral wall opposed to the first peripheral wall, a third peripheral wall, and a fourth peripheral wall opposed to the third peripheral wall, the first connection portion is provided at an end on the first peripheral wall side of the power conversion portion, the second connection portion is provided at an end on the second peripheral wall side of the power conversion portion, the first supply portion is located adjacently to an end on the first peripheral wall side of the third peripheral wall or the fourth peripheral wall, the second supply portion is located adjacently to an end on the second peripheral wall side of the third peripheral wall or the fourth peripheral wall, the first wiring portion extends along the first peripheral wall, between the first connection portion and the first supply portion, and the second wiring portion extends along the second peripheral wall, between the second connection portion and the second supply portion.

In the power conversion device according to the present disclosure, the first connection portion is provided at the end on the first peripheral wall side of the power conversion portion, the second connection portion is provided at the end on the second peripheral wall side of the power conversion portion, the first supply portion is located adjacently to the end on the first peripheral wall side of the third peripheral wall or the fourth peripheral wall, the second supply portion is located adjacently to the end on the second peripheral wall side of the third peripheral wall or the fourth peripheral wall, the first wiring portion extends along the first peripheral wall, between the first connection portion and the first supply portion, and the second wiring portion extends along the second peripheral wall, between the second connection portion and the second supply portion. Thus, irrespective of whether each of the first supply portion and the second supply portion is located adjacently to the end of the third peripheral wall or the end of the fourth peripheral wall, it is possible to suppress size increase of the first wiring portion and the second wiring portion without changing specifications of the power conversion portion which is an expensive large-sized component, and therefore the cost of the first wiring portion and the second wiring portion can be reduced. Since the cost of the first wiring portion and the second wiring portion is reduced and specifications of the power conversion portion are not changed, it is possible to provide the cost-reduced power conversion device.

DETAILED DESCRIPTION OF THE EMBODIMENTS

Figure 1:
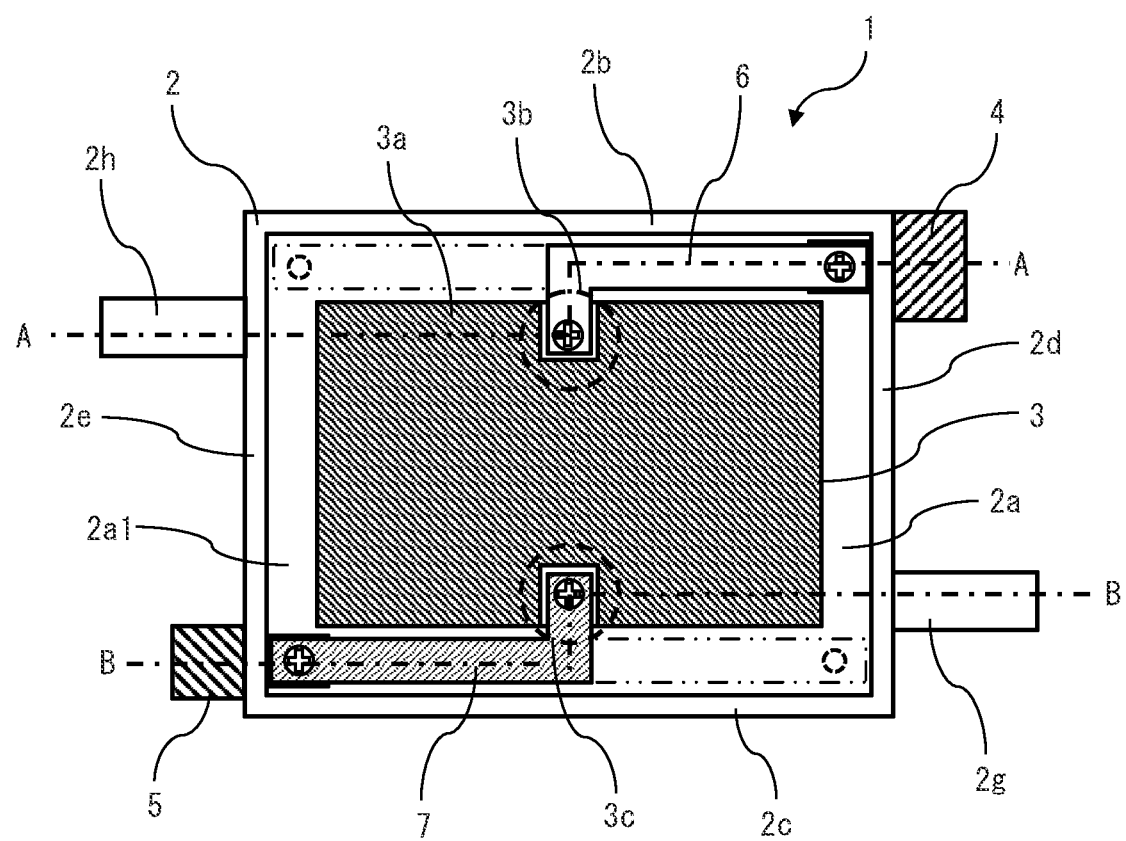
FIG. 1 is a plan view schematically showing a power conversion device according to the first embodiment of the present disclosure.

Hereinafter, a power conversion device according to embodiments of the present disclosure will be described with reference to the drawings. In the drawings, the same or corresponding members and parts are denoted by the same reference characters, to give description.

First Embodiment

Figure 2:
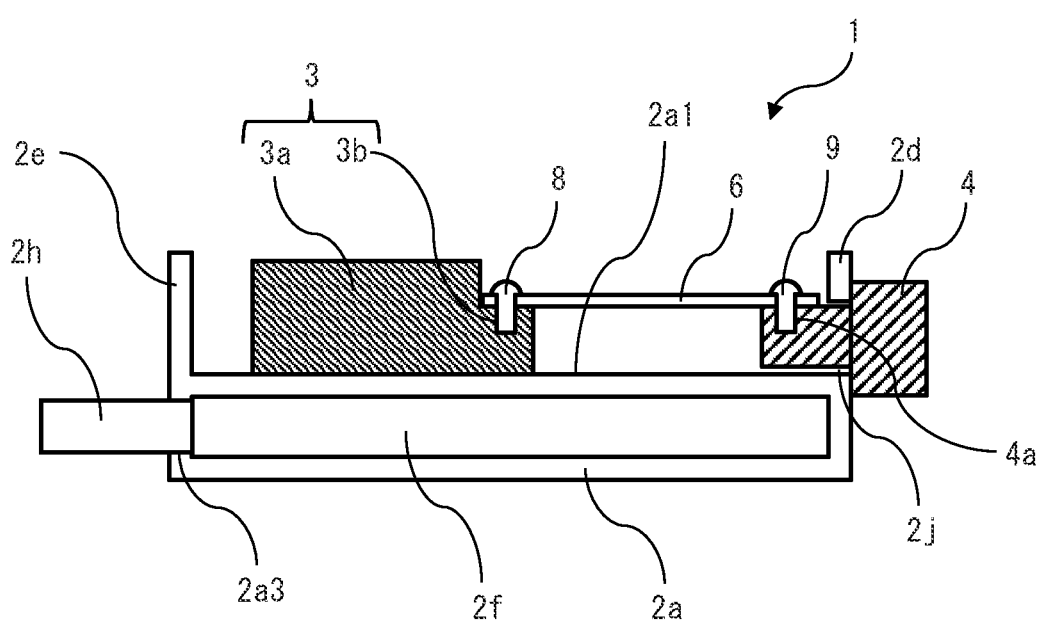
FIG. 2 is a sectional view schematically showing the power conversion device taken at an A-A cross-section position in FIG. 1.
Figure 3:
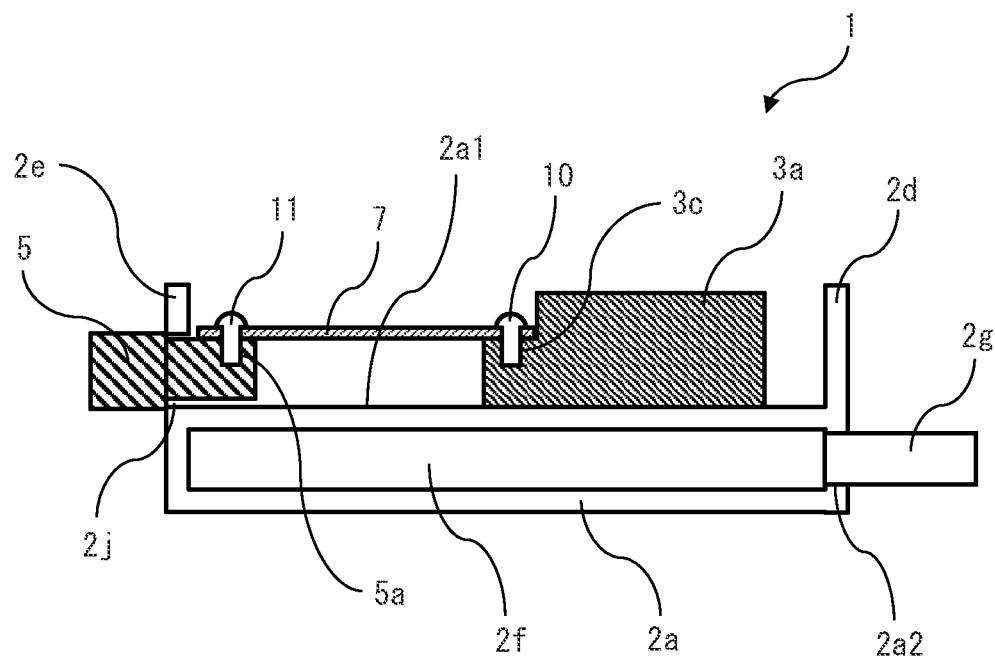
FIG. 3 is a sectional view schematically showing the power conversion device taken at a B-B cross-section position in FIG. 1.
Figure 4:
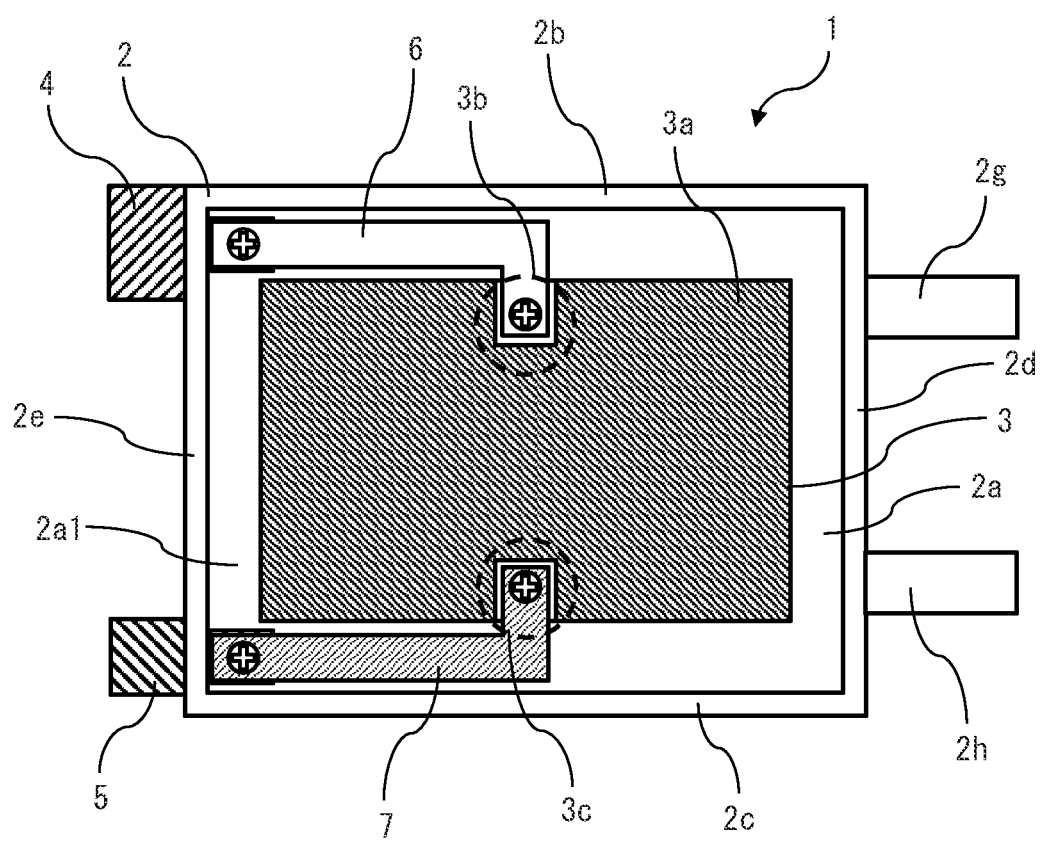
FIG. 4 is a plan view schematically showing another power conversion device according to the first embodiment.
Figure 5:
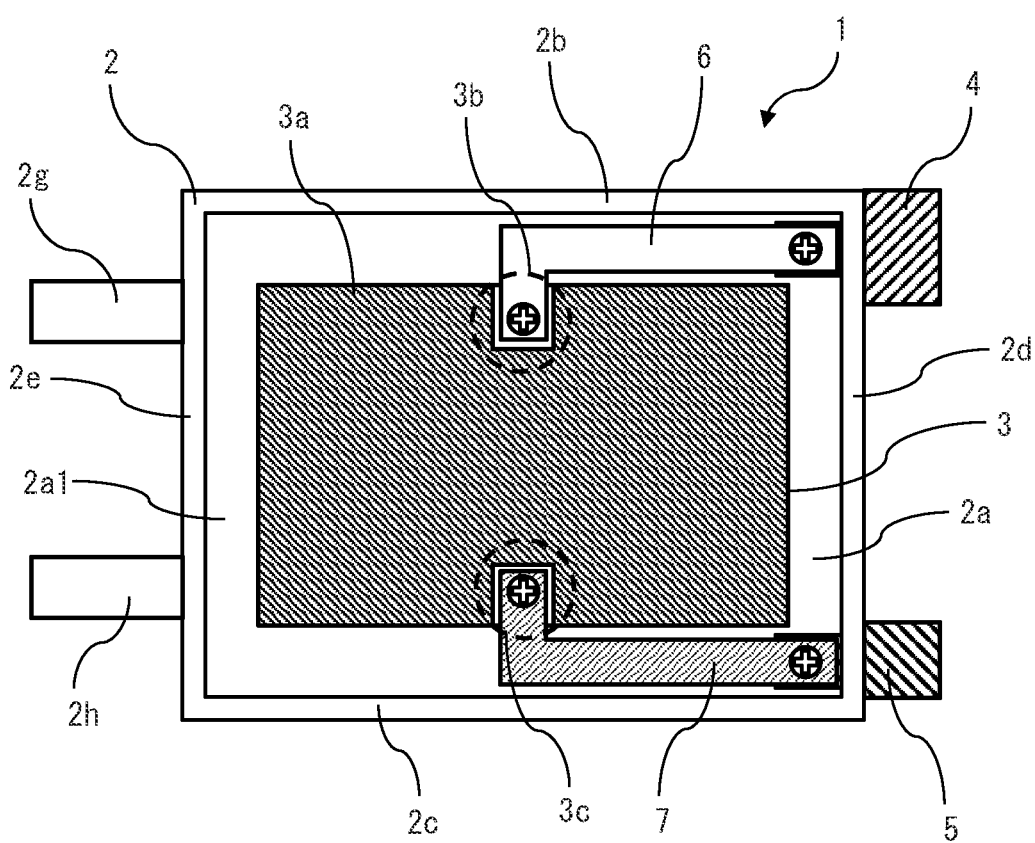
FIG. 5 is a plan view schematically showing another power conversion device according to the first embodiment.
Figure 6:
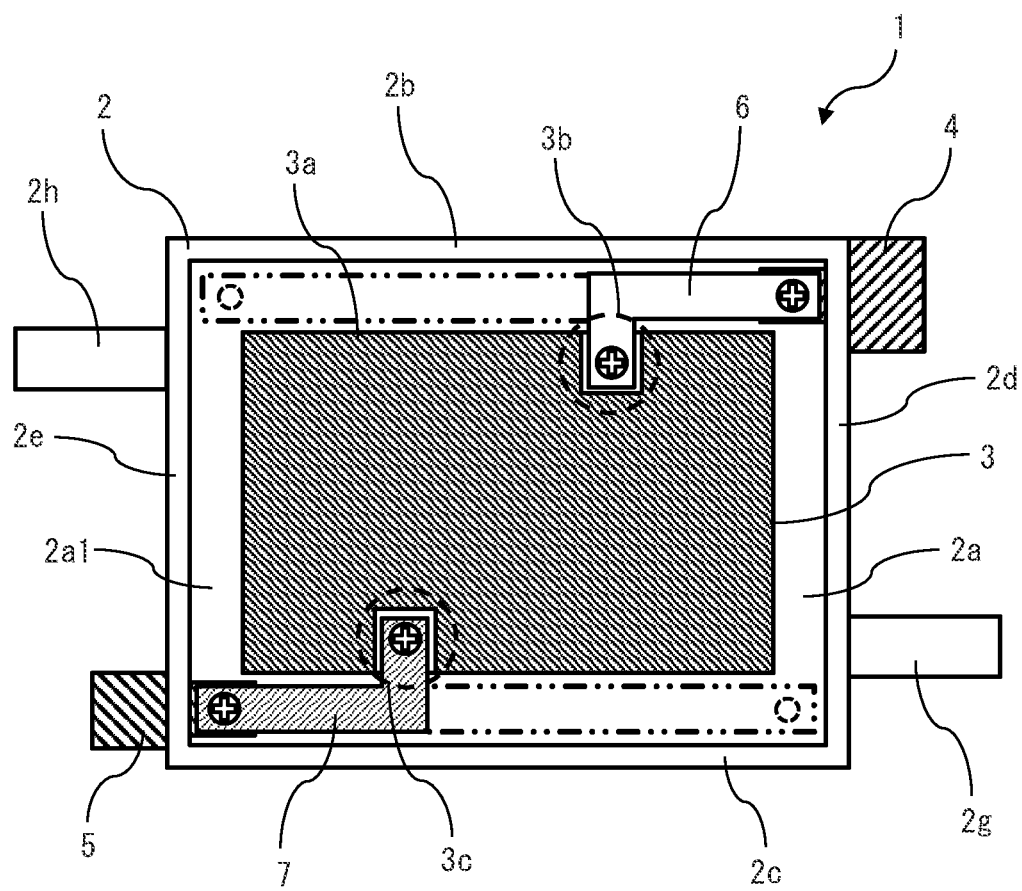
FIG. 6 is a plan view schematically showing another power conversion device according to the first embodiment.

FIG. 1 is a plan view schematically showing a power conversion device 1 according to the first embodiment. FIG. 2 is a sectional view schematically showing the power conversion device 1 taken at an A-A cross-section position in FIG. 1. FIG. 3 is a sectional view schematically showing the power conversion device 1 taken at a B-B cross-section position in FIG. 1. FIGS. 4 to 6 are plan views schematically showing other power conversion devices 1 according to the first embodiment. The power conversion device 1 is a device for converting input current from DC to AC or from AC to DC, or converting input voltage to different voltage. In the present embodiment, the power conversion device 1 is described as a DC-DC converter for converting input voltage to different voltage. However, the power conversion device 1 is not limited to the DC-DC converter.

<Power Conversion Device 1>

As shown in FIG. 1, the power conversion device 1 includes a power conversion portion 3, a first wiring portion 6, a second wiring portion 7, a first supply portion 4, a second supply portion 5, and a housing 2. The power conversion portion 3 includes a power conversion circuit 3a for converting power, and a first connection portion 3b and a second connection portion 3c electrically connecting the power conversion circuit 3a to outside. The first connection portion 3b and the second connection portion 3c are provided at parts enclosed by broken lines. The first wiring portion 6 is electrically connected to the first connection portion 3b. The second wiring portion 7 is electrically connected to the second connection portion 3c. The first supply portion 4 is electrically connected to the first wiring portion 6. The second supply portion 5 is electrically connected to the second wiring portion 7. The housing 2 stores the power conversion portion 3, the first wiring portion 6, and the second wiring portion 7, and has four peripheral walls in a rectangular tube shape. In the present embodiment, the first supply portion 4 is connected to an external device, and supplies power from the external device to the power conversion portion 3 via the first wiring portion 6. The second supply portion 5 is connected to an external device and supplies power from the power conversion portion 3 to the external device via the second wiring portion 7.

Parts composing the power conversion device 1 will be described. The housing 2 is made of a metal material having high thermal conductivity. The metal material is, for example, aluminum. The four peripheral walls in a rectangular tube shape that the housing 2 has are a first peripheral wall 2b, a second peripheral wall 2c opposed to the first peripheral wall 2b, a third peripheral wall 2d, and a fourth peripheral wall 2e opposed to the third peripheral wall 2d. The rectangular tube shape refers to a tube shape whose cross-section has a rectangular shape. In the present embodiment, the housing 2 has a lid wall 2a covering an opening of the four peripheral walls. A surface of the lid wall 2a surrounded by the four peripheral walls is a cooling surface 2a1. As shown in FIG. 2, the power conversion portion 3 is fixed to the cooling surface 2a1 of the housing 2 and is thermally connected to the housing 2. Since the power conversion portion 3 is thermally connected to the cooling surface 2a1 of the housing 2, the power conversion portion 3 can be efficiently cooled. In the present embodiment, the housing 2 has a coolant path 2f described later, and therefore the power conversion portion 3 can be more efficiently cooled.

The housing 2 has the coolant path 2f through which a coolant flows to cool the power conversion portion 3, an inlet pipe 2g through which the coolant flows into the coolant path 2f, and an outlet pipe 2h through which the coolant flows out from the coolant path 2f. In the present embodiment, the coolant path 2f is formed inside the lid wall 2a. As shown in FIG. 1, the inlet pipe 2g and the outlet pipe 2h are provided so as to protrude outward from outer wall side surfaces of the housing 2. As shown in FIG. 3, the inlet pipe 2g is fitted to an inlet pipe through-hole 2a2 provided in the side surface of the lid wall 2a and corresponding to the shape of the inlet pipe 2g. In a case where the inlet pipe 2g has a cylindrical shape, the inlet pipe through-hole 2a2 has a round shape. As shown in FIG. 2, the outlet pipe 2h is fitted to an outlet pipe through-hole 2a3 provided in the side surface of the lid wall 2a and corresponding to the shape of the outlet pipe 2h. In a case where the outlet pipe 2h has a cylindrical shape, the outlet pipe through-hole 2a3 has a round shape.

At least one of the inlet pipe 2g and the outlet pipe 2h is located on the third peripheral wall 2d side or the fourth peripheral wall 2e side. In the present embodiment, the inlet pipe 2g is located on the third peripheral wall 2d side and the outlet pipe 2h is located on the fourth peripheral wall 2e side. The locations of the inlet pipe 2g and the outlet pipe 2h are not limited thereto. For example, the inlet pipe 2g may be located on the fourth peripheral wall 2e side and the outlet pipe 2h may be located on the third peripheral wall 2d side, or both of the inlet pipe 2g and the outlet pipe 2h may be located on the third peripheral wall 2d side or the fourth peripheral wall 2e side. One or both of the inlet pipe 2g and the outlet pipe 2h may be located on a surface of the lid wall 2a on a side opposite to the cooling surface 2a1.

The power conversion portion 3 is a DC-DC converter for converting DC power of a high-voltage battery to DC power having different voltage. The power conversion portion 3 is composed of a switching element, a transformer, a smoothing reactor, a capacitor, and the like. In the drawings, locations and shapes of components composing the power conversion portion 3 are omitted without being shown. The first connection portion 3b and the second connection portion 3c are, for example, screw holes provided in portions extending from parts of components of the power conversion circuit 3a. In the drawings, the extending portions are not shown.

The first supply portion 4 and the second supply portion 5 are formed by connectors, for example. The connectors are general universal connectors. The connectors are fixed to the lid wall 2a or the four peripheral walls. As shown in FIG. 2, a screw hole 4a is formed in a part of the first supply portion 4 connected to the first wiring portion 6, and the first wiring portion 6 and the first supply portion 4 are connected by a screw 9. As shown in FIG. 3, a screw hole 5a is formed in a part of the second supply portion 5 connected to the second wiring portion 7, and the second wiring portion 7 and the second supply portion 5 are connected by a screw 11. In the configuration of the power conversion device 1 according to the present disclosure described later, specifications of expensive large-sized components need not be changed and therefore low-cost universal connectors for which various types are present can be used. Since low-cost universal connectors can be used, the cost of the power conversion device 1 can be reduced. In addition, since the connectors are universal connectors, the connectors can be easily attached to the housing 2, and thus productivity of the power conversion device 1 can be improved.

The housing 2 has a through-hole 2j in one or more of the lid wall 2a, the first peripheral wall 2b, the second peripheral wall 2c, the third peripheral wall 2d, and the fourth peripheral wall 2e, and the connector penetrates the through-hole 2j and is fixed to the penetrated wall. In the present embodiment, the first supply portion 4 penetrates the through-hole 2j provided in the third peripheral wall 2d. In a state in which the screw hole 4a is located inside the housing 2, the first supply portion 4 is fixed at a part of the third peripheral wall 2d near the first peripheral wall 2b by a fastening member (not shown). The second supply portion 5 penetrates the through-hole 2j provided in the fourth peripheral wall 2e. In a state in which the screw hole 5a is located inside the housing 2, the second supply portion 5 is fixed at a part of the fourth peripheral wall 2e near the second peripheral wall 2c by a fastening member (not shown).

In the present embodiment, the second supply portion 5 is located at the fourth peripheral wall 2e on a side opposite to the third peripheral wall 2d where the first supply portion 4 is provided, and the first supply portion 4 is located at the third peripheral wall 2d on a side opposite to the fourth peripheral wall 2e where the second supply portion 5 is provided. However, the present disclosure is not limited thereto. As shown in FIGS. 4 and 5, the first supply portion 4 and the second supply portion 5 may be located at the same peripheral wall. In a case where the first supply portion 4 and the second supply portion 5 are located at the same peripheral wall, both of the inlet pipe 2g and the outlet pipe 2h may be located at the peripheral wall on a side opposite to the peripheral wall where the first supply portion 4 and the second supply portion 5 are provided.

The first wiring portion 6 and the second wiring portion 7 are formed by metal-plate members made of a metal material having high electrical conductivity. The metal material is, for example, copper. Each of the first wiring portion 6 and the second wiring portion 7 has through-holes at both ends. As shown in FIG. 2, the first wiring portion 6 is connected to the first connection portion 3b by fastening a screw 8 to the first connection portion 3b which is a screw hole via one through-hole of the first wiring portion 6. The first wiring portion 6 is connected to the first supply portion 4 by fastening a screw 9 to the screw hole 4a via the other through-hole of the first wiring portion 6. The first connection portion 3b and the first supply portion 4 are electrically connected via the first wiring portion 6. As shown in FIG. 3, the second wiring portion 7 is connected to the second connection portion 3c by fastening a screw 10 to the second connection portion 3c which is a screw hole via one through-hole of the second wiring portion 7. The second wiring portion 7 is connected to the second supply portion 5 by fastening a screw 11 to the screw hole 5a via the other through-hole of the second wiring portion 7. The second connection portion 3c and the second supply portion 5 are electrically connected via the second wiring portion 7.

In the present embodiment, the plate-shaped first and second wiring portions 6 and 7 having the through-holes are fixed to the respective parts by the screws 8 to 11 and are electrically connected to the respective parts. However, the present disclosure is not limited thereto. For the first connection portion 3b, the second connection portion 3c, the first supply portion 4, the second supply portion 5, the first wiring portion 6, and the second wiring portion 7, there are various configurations and connection methods, which may be combined in many ways. For example, the first wiring portion 6 and the second wiring portion 7 may have screw holes at ends thereof. In a case where the first wiring portion 6 and the second wiring portion 7 have screw holes at ends thereof, through-holes instead of screw holes are provided on the sides to be connected with the ends of the first wiring portion 6 and the second wiring portion 7, and both parts are fastened by screws. The first wiring portion 6 and the second wiring portion 7 may be formed by a harness.

The first connection portion 3b, the second connection portion 3c, the first supply portion 4, and the second supply portion 5 may be formed such that a cylindrical member having a screw shape at an end thereof is covered with resin. Connection between the first wiring portion 6 and the second wiring portion 7, and the respective parts, may be made by welding, instead of screw fixation. The first connection portion 3b and the second connection portion 3c may be formed by through-holes provided at a board, ends of the first wiring portion 6 and the second wiring portion 7 may be inserted into the through-holes, and the first wiring portion 6 and the second wiring portion 7 may be fixed to the through-holes by soldering. Different connection methods may be used for respective connection parts. For example, the first connection portion 3b and one end of the first wiring portion 6 may be connected by soldering, and another end of the first wiring portion 6 and the first supply portion 4 may be connected by a screw.

One or both of the first wiring portion 6 and the second wiring portion 7 have shapes that allow attachment thereof such that the extending direction toward the third peripheral wall 2d side or the fourth peripheral wall 2e side is reversed. In the present embodiment, as shown by two-dot dashed lines in FIG. 1, both of the first wiring portion 6 and the second wiring portion 7 have shapes that allow attachment thereof such that the extending direction toward the third peripheral wall 2d side or the fourth peripheral wall 2e side is reversed. Depending on the vehicle type, the first supply portion 4 may be provided on the fourth peripheral wall 2e side, as shown in FIG. 4. Meanwhile, the second supply portion 5 may be provided on the third peripheral wall 2d side, as shown in FIG. 5. Even in a case where the first supply portion 4 or the second supply portion 5 is transferred to the opposed peripheral side as described above, if the first wiring portion 6 and the second wiring portion 7 have shapes that allow attachment thereof in a reversed state, it is possible to share the first wiring portion 6 and the second wiring portion 7 in common among various vehicle types without changing the shapes of the first wiring portion 6 and the second wiring portion 7 and without replacing the first wiring portion 6 and the second wiring portion 7 with other wiring members. Since the first wiring portion 6 and the second wiring portion 7 are shared in common, the component-production volume can be easily increased and the component cost can be reduced. Since the component cost is reduced, the cost of the power conversion device 1 can be reduced.

COMPARATIVE EXAMPLES

Figure 23:
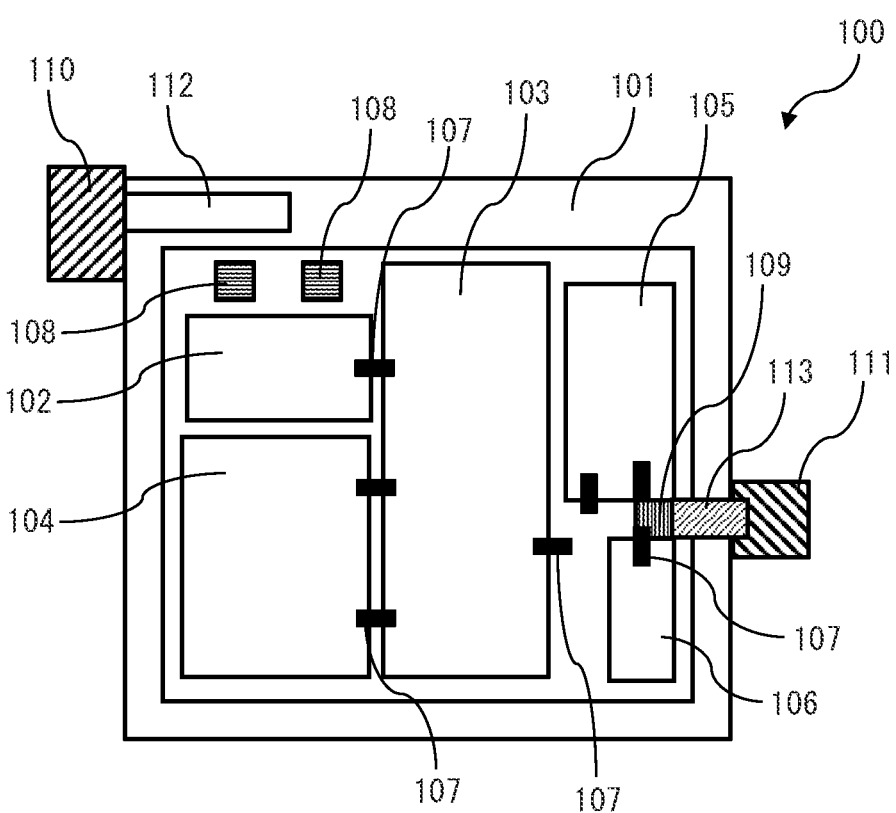
FIG. 23 is a plan view schematically showing a power conversion device in a comparative example.
Figure 24:
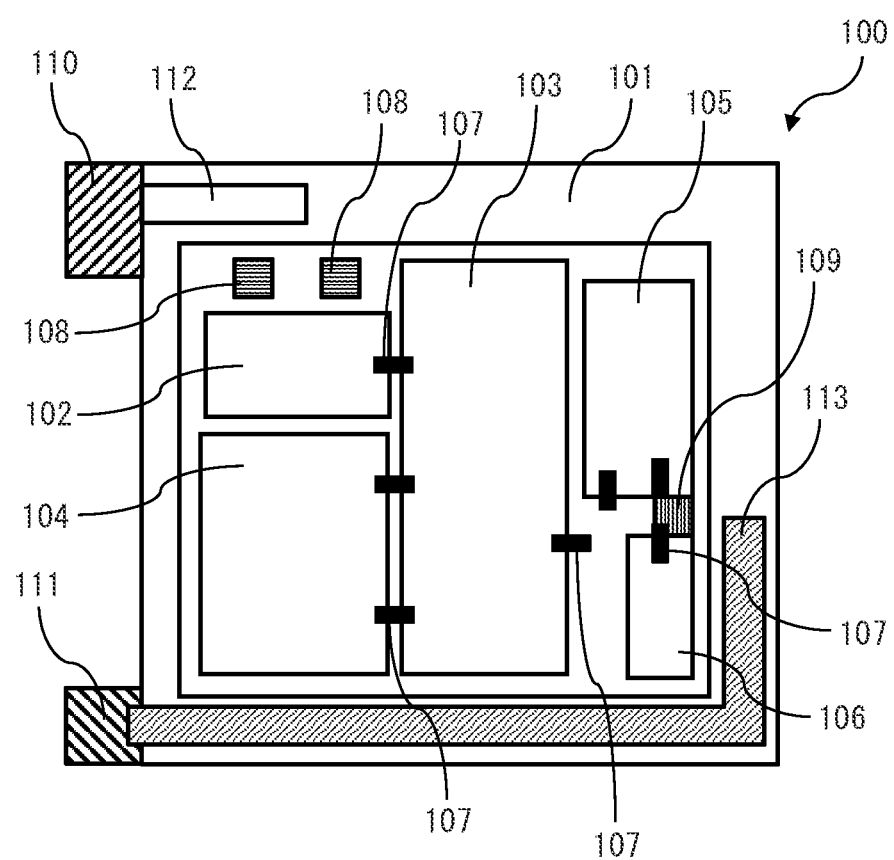
FIG. 24 is a plan view schematically showing a power conversion device in another comparative example.
Figure 25:
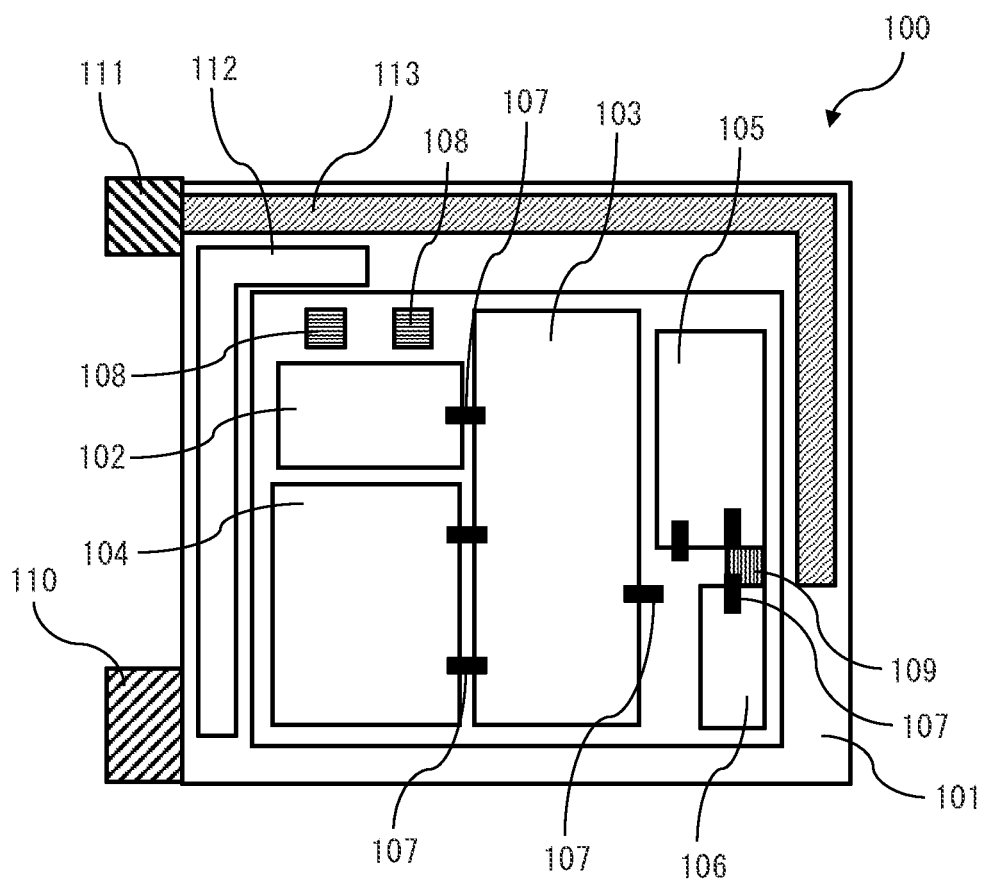
FIG. 25 is a plan view schematically showing a power conversion device in another comparative example.

Before description of major part of the present disclosure, comparative examples will be described. FIG. 23 is a plan view schematically showing a power conversion device 100 in a comparative example. FIG. 24 is a plan view schematically showing a power conversion device 100 in another comparative example. FIG. 25 is a plan view schematically showing a power conversion device 100 in another comparative example. The power conversion devices 100 in the comparative examples are DC-DC converters. Each figure is a schematic diagram showing the layout of the DC-DC converter. The power conversion device 100 includes a cooling block 101, an input filter 102, a power module 103, a transformer 104, a choke coil 105, a smoothing capacitor 106, an input terminal 108, an output terminal 109, and interfaces 110, 111. Component-to-component connection portions 107 are parts connecting components. The cooling block 101 stores the input filter 102, the power module 103, the transformer 104, the choke coil 105, the smoothing capacitor 106, the input terminal 108, and the output terminal 109. The input terminal 108 and the interface 110 are connected by a wiring member 112. The output terminal 109 and the interface 111 are connected by a wiring member 113.

In a case where the positions of the interfaces 110, 111 are changed, the shapes of the wiring members 112, 113 connecting the input and output terminals 108, 109 and the interfaces 110, 111 are changed, and by using the shape-changed wiring members 112, 113, it is possible to adapt to the above position change without changing specifications of expensive large-sized components (e.g., power module 103, transformer 104, choke coil 105). In FIG. 24, the location of the interface 111 is different from that in FIG. 23, and in FIG. 25, the locations of the interfaces 110, 111 are different from those in FIG. 23. Although it is possible to adapt to such changes without changing specifications of expensive large-sized components, the size of the wiring member 113 increases in FIG. 24, and the sizes of the wiring members 112, 113 increase in FIG. 25.

Since the sizes of the wiring members 112, 113 increase, the cost of the wiring members 112, 113 increases. In addition, because of size increase of the wiring members 112, 113, the heat-generation amounts of the wiring members 112, 113 increase, so that an additional cooling member is needed. Thus, the cost of the power conversion device 100 increases. In addition, as the sizes of the wiring members 112, 113 increase, structures (e.g., screw fixation) required for ensuring vibration resistance for the wiring members 112, 113 need to be increasingly provided, so that the cost of the power conversion device 100 increases and the size of the power conversion device 100 increases. Further, for ensuring insulation between the wiring members 112, 113 and respective components or between the wiring members 112, 113 and the cooling block 101, it is necessary to provide spaces around the wiring members 112, 113. Therefore, as the sizes of the wiring members 112, 113 increase, the size of the power conversion device 100 increases.

<Wiring Configuration of Power Conversion Device 1>

The wiring configuration of the power conversion device 1 of the present disclosure that can provide the cost-reduced power conversion device 1 without changing specifications of expensive large-sized components, will be described. As shown in FIG. 1, the first connection portion 3*b* is provided at the end on the first peripheral wall 2*b* side of the power conversion portion 3, and the second connection portion 3*c* is provided at the end on the second peripheral wall 2*c* side of the power conversion portion 3. The first supply portion 4 is located adjacently to the end on the first peripheral wall 2*b* side of the third peripheral wall 2*d* or the fourth peripheral wall 2*e*, and the second supply portion 5 is located adjacently to the end on the second peripheral wall 2*c* side of the third peripheral wall 2*d* or the fourth peripheral wall 2*e*. The first wiring portion 6 extends along the first peripheral wall 2*b*, between the first connection portion 3*b* and the first supply portion 4, and the second wiring portion 7 extends along the second peripheral wall 2*c*, between the second connection portion 3*c* and the second supply portion 5.

In the example shown in FIG. 1, the first supply portion 4 is located at the third peripheral wall 2*d* adjacently to the end on the first peripheral wall 2*b* side of the third peripheral wall 2*d*, and the second supply portion 5 is located at the fourth peripheral wall 2*e* adjacently to the end on the second peripheral wall 2*c* side of the fourth peripheral wall 2*e*. In the example shown in FIG. 4, the first supply portion 4 is located at the fourth peripheral wall 2*e* adjacently to the end on the first peripheral wall 2*b* side of the fourth peripheral wall 2*e*, and the second supply portion 5 is located at the fourth peripheral wall 2*e* adjacently to the end on the second peripheral wall 2*c* side of the fourth peripheral wall 2*e*. In the example shown in FIG. 5, the first supply portion 4 is located at the third peripheral wall 2*d* adjacently to the end on the first peripheral wall 2*b* side of the third peripheral wall 2*d*, and the second supply portion 5 is located at the third peripheral wall 2*d* adjacently to the end on the second peripheral wall 2*c* side of the third peripheral wall 2*d*.

As described above, the first connection portion 3*b* is provided at the end on the first peripheral wall 2*b* side of the power conversion portion 3, the first supply portion 4 is located adjacently to the end on the first peripheral wall 2*b* side of the third peripheral wall 2*d* or the fourth peripheral wall 2*e*, and the first wiring portion 6 extends along the first peripheral wall 2*b*, between the first connection portion 3*b* and the first supply portion 4. Thus, irrespective of whether the first supply portion 4 is located at the third peripheral wall 2*d* or the fourth peripheral wall 2*e*, it is possible to suppress size increase of the first wiring portion 6 without changing specifications of the power conversion portion 3 which is an expensive large-sized component. Since size increase of the first wiring portion 6 is suppressed, the cost of the first wiring portion 6 can be reduced. Since the cost of the first wiring portion 6 is reduced and specifications of the power conversion portion 3 are not changed, it is possible to provide the cost-reduced power conversion device 1. In addition, since specifications of the power conversion portion 3 which is an expensive large-sized component are not changed, the component-production volume for expensive large-sized components can be increased.

Similarly, since the second connection portion 3*c* is provided at the end on the second peripheral wall 2*c* side of the power conversion portion 3, the second supply portion 5 is located adjacently to the end on the second peripheral wall 2*c* side of the third peripheral wall 2*d* or the fourth peripheral wall 2*e*, and the second wiring portion 7 extends along the second peripheral wall 2*c*, between the second connection portion 3*c* and the second supply portion 5. Thus, irrespective of whether the second supply portion 5 is located at the third peripheral wall 2*d* or the fourth peripheral wall 2*e*, it is possible to suppress size increase of the second wiring portion 7 without changing specifications of the power conversion portion 3 which is an expensive large-sized component. Since size increase of the second wiring portion 7 is suppressed, the cost of the second wiring portion 7 can be reduced. Since the cost of the second wiring portion 7 is reduced and specifications of the power conversion portion 3 are not changed, it is possible to provide the cost-reduced power conversion device 1. In addition, since specifications of the power conversion portion 3 which is an expensive large-sized component are not changed, the component-production volume for expensive large-sized components can be increased.

As compared to the locations of the input terminal 108 and the output terminal 109 shown in the comparative example in FIG. 24 or FIG. 25, the first connection portion 3*b* and the second connection portion 3*c* can be respectively located closely to the first supply portion 4 and the second supply portion 5, whereby the sizes of the first wiring portion 6 and the second wiring portion 7 can be reduced. Since the sizes of the first wiring portion 6 and the second wiring portion 7 are reduced, the cost of the first wiring portion 6 and the second wiring portion 7 can be reduced. In addition, it is possible to easily adapt to location change of the first supply portion 4 or the second supply portion 5 without changing specifications of the power conversion portion 3 which is an expensive large-sized component.

One or both of the first connection portion 3*b* and the second connection portion 3*c* are located at center positions between the third peripheral wall 2*d* and the fourth peripheral wall 2*e*. In the present embodiment, as shown in FIG. 1, both of the first connection portion 3*b* and the second connection portion 3*c* are located at center positions between the third peripheral wall 2*d* and the fourth peripheral wall 2*e*. With this configuration, as shown in FIG. 4 or FIG. 5, even in a case where the first supply portion 4 or the second supply portion 5 is transferred to the opposed peripheral wall side, it is possible to adapt thereto without increasing the sizes of the first wiring portion 6 and the second wiring portion 7, and therefore the cost of the first wiring portion 6 and the second wiring portion 7 can be reduced. Since the cost of the first wiring portion 6 and the second wiring portion 7 is reduced, the cost of the power conversion device 1 can be reduced.

In the present embodiment, one or both of the first connection portion 3*b* and the second connection portion 3*c* are located at center positions between the third peripheral wall 2*d* and the fourth peripheral wall 2*e*. However, the locations of the first connection portion 3*b* and the second connection portion 3*c* are not limited thereto. One or both of the first connection portion 3*b* and the second connection portion 3*c* may be located on the third peripheral wall 2*d* side or the fourth peripheral wall 2*e* side between the third peripheral wall 2*d* and the fourth peripheral wall 2*e*. In FIG. 6, the first connection portion 3*b* is located on the third peripheral wall 2*d* side between the third peripheral wall 2*d* and the fourth peripheral wall 2*e*, and the second connection portion 3*c* is located on the fourth peripheral wall 2*e* side between the third peripheral wall 2*d* and the fourth peripheral wall 2*e*. Even in such locations, the first connection portion 3*b* is provided at the end on the first peripheral wall 2*b* side of the power conversion portion 3, and the second connection portion 3*c* is provided at the end on the second peripheral wall 2*c* side of the power conversion portion 3, and therefore size increase of the first wiring portion 6 and the second wiring portion 7 can be suppressed. In FIG. 6, in a case where the first supply portion 4 or the second supply portion 5 is located at the peripheral wall on the opposite side because of vehicle type change or the like, the shapes of the first wiring portion 6 and the second wiring portion 7 may be changed to shapes as shown by two-dot dashed lines in FIG. 6, to adapt to the above location change.

In the present embodiment, as shown in FIG. 1, the first wiring portion 6 and the second wiring portion 7 are located so as to be arranged in the plane direction such that they do not overlap the power conversion portion 3 in the height direction. The locations of the first wiring portion 6 and the second wiring portion 7 are not limited thereto. The first wiring portion 6 and the second wiring portion 7 may be located so as to be stacked in the height direction over the power conversion portion 3.

In the present embodiment, at least one of the inlet pipe 2g and the outlet pipe 2h is located on the third peripheral wall 2d side or the fourth peripheral wall 2e side. As described above, the degree of freedom in the locations of the first supply portion 4 and the second supply portion 5 is high, and therefore each of the inlet pipe 2g and the outlet pipe 2h is located on the peripheral wall side where the first supply portion 4 or the second supply portion 5 is located. Even in a case where the location of the inlet pipe 2g or the outlet pipe 2h needs to be changed depending on each vehicle type, it is possible to share expensive large-sized components in common among various vehicle types without changing the shape of the power conversion portion 3. Since expensive large-sized components are shared in common, the component-production volume can be increased and the component cost can be reduced. Since the component cost is reduced, the cost of the power conversion device 1 can be reduced.

As described above, in the power conversion device 1 according to the first embodiment, the first connection portion 3b is provided at the end on the first peripheral wall 2b side of the power conversion portion 3, the second connection portion 3c is provided at the end on the second peripheral wall 2c side of the power conversion portion 3, the first supply portion 4 is located adjacently to the end on the first peripheral wall 2b side of the third peripheral wall 2d or the fourth peripheral wall 2e, the second supply portion 5 is located adjacently to the end on the second peripheral wall 2c side of the third peripheral wall 2d or the fourth peripheral wall 2e, the first wiring portion 6 extends along the first peripheral wall 2b, between the first connection portion 3b and the first supply portion 4, and the second wiring portion 7 extends along the second peripheral wall 2c, between the second connection portion 3c and the second supply portion 5. Thus, irrespective of whether each of the first supply portion 4 and the second supply portion 5 is located adjacently to the end of the third peripheral wall 2d or the end of the fourth peripheral wall 2e, it is possible to suppress size increase of the first wiring portion 6 and the second wiring portion 7 without changing specifications of the power conversion portion 3 which is an expensive large-sized component. Since size increase of the first wiring portion 6 and the second wiring portion 7 is suppressed, the cost of the first wiring portion 6 and the second wiring portion 7 can be reduced. Since the cost of the first wiring portion 6 and the second wiring portion 7 is reduced and specifications of the power conversion portion 3 are not changed, it is possible to provide the cost-reduced power conversion device 1.

One or both of the first connection portion 3b and the second connection portion 3c may be located at center positions between the third peripheral wall 2d and the fourth peripheral wall 2e. Thus, even in a case where the first supply portion 4 or the second supply portion 5 is transferred to the opposed peripheral wall side, it is possible to adapt thereto without increasing the sizes of the first wiring portion 6 and the second wiring portion 7, and therefore the cost of the first wiring portion 6 and the second wiring portion 7 can be reduced. Since the cost of the first wiring portion 6 and the second wiring portion 7 is reduced, the cost of the power conversion device 1 can be reduced.

One or both of the first wiring portion 6 and the second wiring portion 7 may have shapes that allow attachment thereof such that the extending direction toward the third peripheral wall 2d side or the fourth peripheral wall 2e side is reversed. Thus, even if the first supply portion 4 or the second supply portion 5 is transferred to the opposed peripheral wall side, it is possible to share the first wiring portion 6 and the second wiring portion 7 in common among various vehicles types without changing the shapes of the first wiring portion 6 and the second wiring portion 7 and without replacing the first wiring portion 6 and the second wiring portion 7 with other wiring portions. Since the first wiring portion 6 and the second wiring portion 7 are shared in common, the component-production volume can be easily increased and the component cost can be reduced. Since the component cost is reduced, the cost of the power conversion device 1 can be reduced.

The first supply portion 4 and the second supply portion 5 may be formed by connectors, and the connectors may be fixed to the lid wall 2a or the four peripheral walls. Thus, since low-cost universal connectors can be used, the cost of the power conversion device 1 can be reduced. In addition, since the connectors are universal connectors, the connectors can be easily attached to the housing 2, and thus productivity of the power conversion device 1 can be improved.

At least one of the inlet pipe 2g and the outlet pipe 2h may be located on the third peripheral wall 2d side or the fourth peripheral wall 2e side. Thus, even in a case where the location of the inlet pipe 2g or the outlet pipe 2h needs to be changed depending on each vehicle type, it is possible to share expensive large-sized components in common among various vehicle types without changing the shape of the power conversion portion 3, whereby the component cost can be reduced. Since the component cost is reduced, the cost of the power conversion device 1 can be reduced.

Second Embodiment

Figure 7:
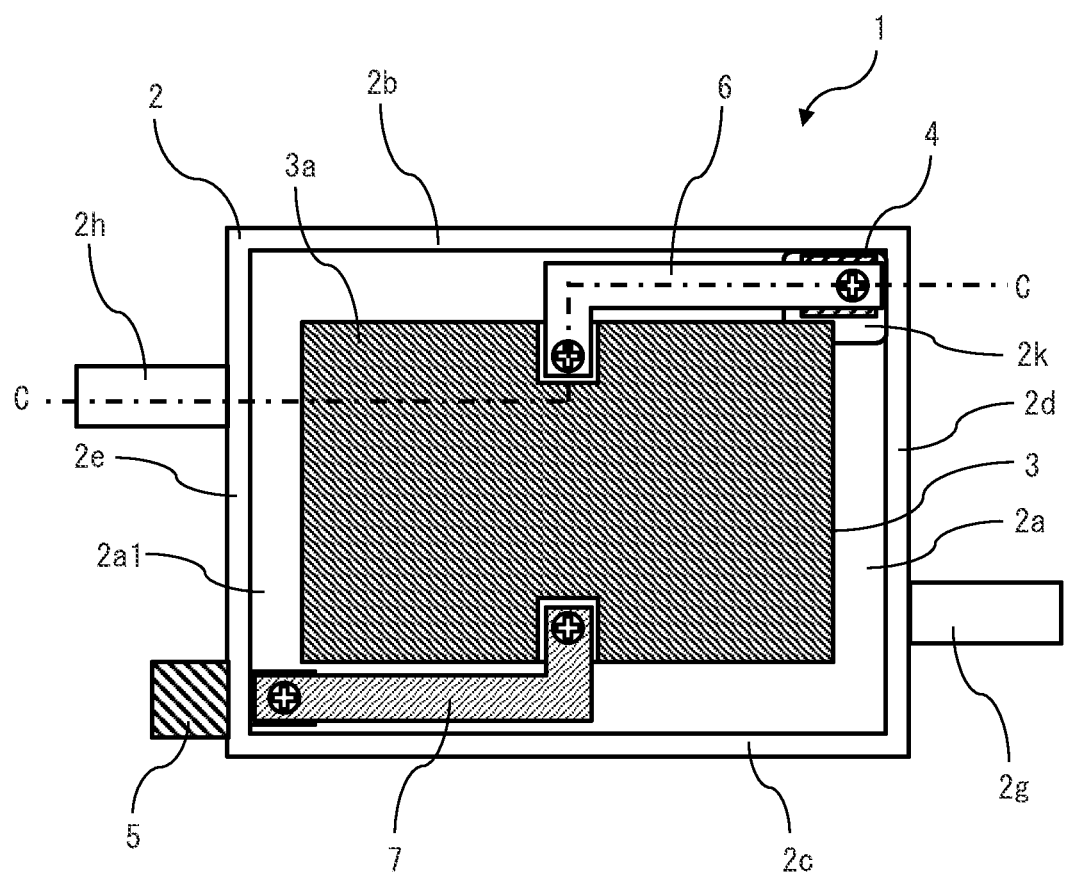
FIG. 7 is a plan view schematically showing a power conversion device according to the second embodiment of the present disclosure.
Figure 8:
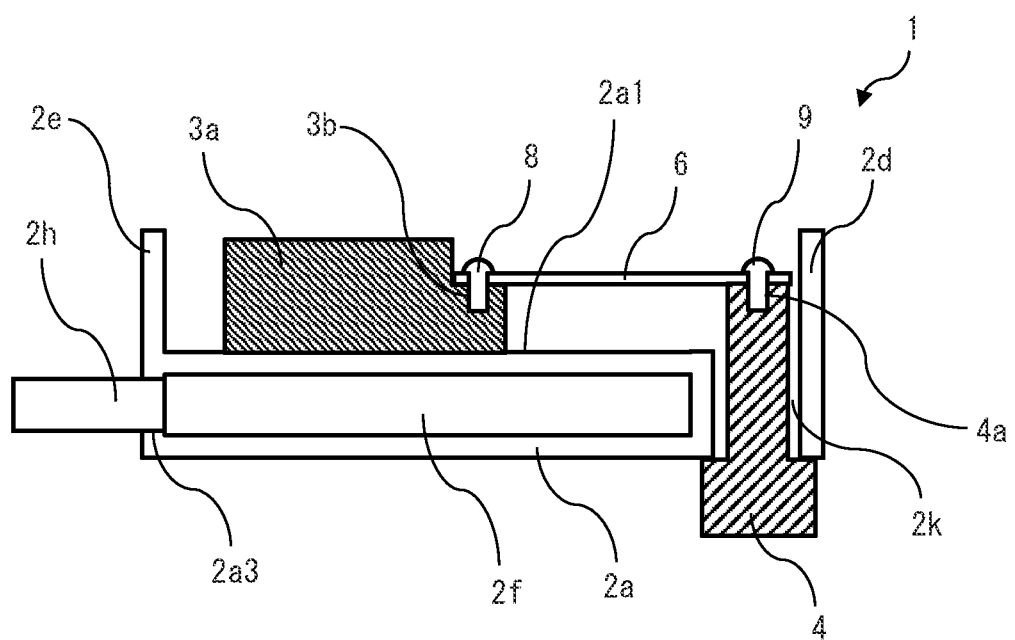
FIG. 8 is a sectional view schematically showing a power conversion device taken at a C-C cross-section position in FIG. 7.

A power conversion device 1 according to the second embodiment of the present disclosure will be described. FIG. 7 is a plan view schematically showing the power conversion device 1 according to the second embodiment. FIG. 8 is a sectional view schematically showing the power conversion device 1 taken at a C-C cross-section position in FIG. 7. In the power conversion device 1 according to the second embodiment, the first supply portion 4 is located at the lid wall 2a adjacently to the end on the first peripheral wall 2b side of the third peripheral wall 2d.

In the power conversion device 1 according to the present disclosure, the first supply portion 4 is located adjacently to the end on the first peripheral wall 2b side of the third peripheral wall 2d or the fourth peripheral wall 2e, and the second supply portion 5 is located adjacently to the end on the second peripheral wall 2c side of the third peripheral wall 2d or the fourth peripheral wall 2e. In the present embodiment, as shown in FIG. 8, the first supply portion 4 is located at the lid wall 2a adjacently to the end on the first peripheral wall 2b side of the third peripheral wall 2d, and as shown in FIG. 7, the second supply portion 5 is located at the fourth peripheral wall 2e adjacently to the end on the second peripheral wall 2c side of the fourth peripheral wall 2e. The location of the second supply portion 5 is the same as that shown in FIG. 1 in the first embodiment. The first supply portion 4 and the second supply portion 5 are, for example, connectors.

The housing 2 has a through-hole 2k penetrating the lid wall 2a, at a part of the lid wall 2a where the first supply portion 4 is located. The through-hole 2k is formed so as to penetrate in a direction perpendicular to the cooling surface 2a1, and has a size that allows the first supply portion 4 to penetrate therethrough. The first supply portion 4 penetrates the through-hole 2k from a surface on a side opposite to the cooling surface 2a1, and is fixed in a state of partially protruding from the cooling surface 2a1. In a state in which the screw hole 4a is located inside the housing 2, the first supply portion 4 is fixed at a part of the third peripheral wall 2d near the first peripheral wall 2b by a fastening member (not shown), for example.

In the present embodiment, only the first supply portion 4 is located on the lid wall 2a side while penetrating the through-hole 2k. However, without limitation thereto, also the second supply portion 5 may be located on the lid wall 2a side while penetrating a through-hole in the same manner. Alternatively, only the second supply portion 5 may be located on the lid wall 2a side while penetrating a through-hole.

As described above, in the power conversion device 1 according to the second embodiment, one or both of the first supply portion 4 and the second supply portion 5 are located at the lid wall 2a. Thus, in view of the layout in the vehicle, even in a case where one or both of the first supply portion 4 and the second supply portion 5 cannot be located on the peripheral wall side of the housing 2 and need to be located on the lid wall 2a side, and the locations thereof need to be changed depending on each vehicle type, it is possible to share expensive large-sized components in common among various vehicle types without changing the shape of the power conversion portion 3 which is an expensive large-sized component, whereby the component cost can be reduced. Since the component cost is reduced, the cost of the power conversion device 1 can be reduced. In addition, since specifications of the power conversion portion 3 which is an expensive large-sized component are not changed, the production volume for expensive large-sized components can be easily increased.

Third Embodiment

Figure 9:
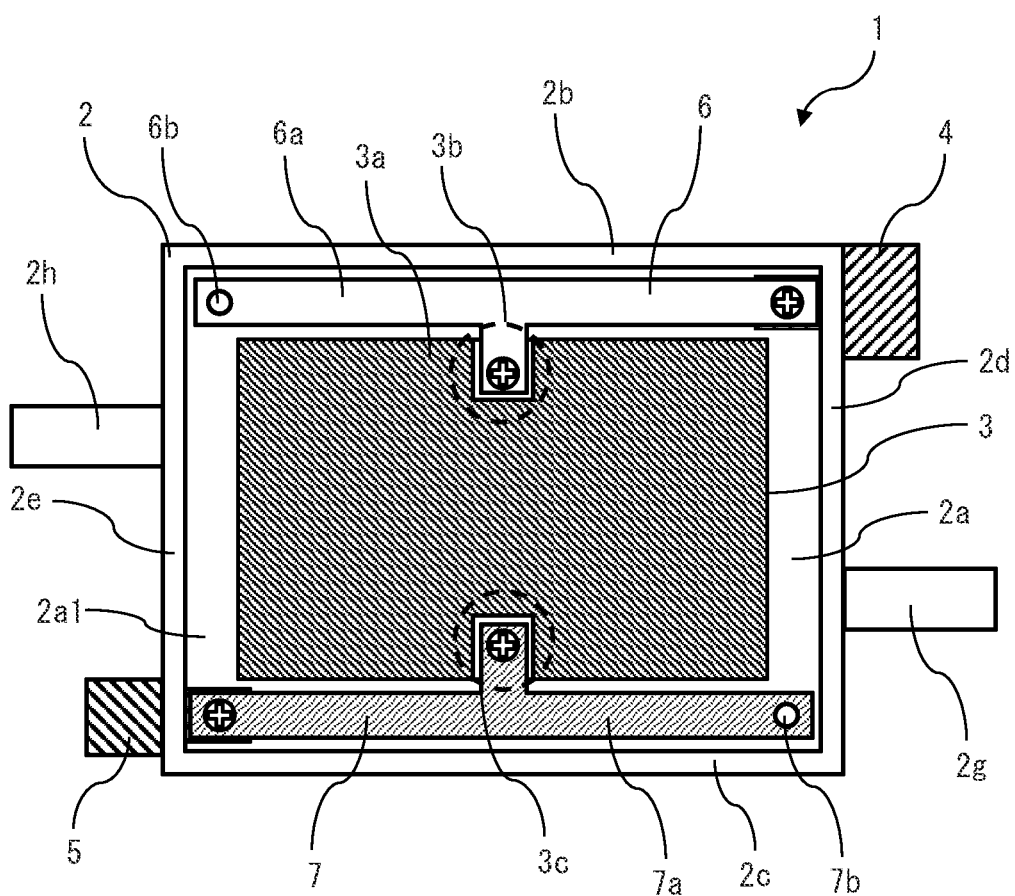
FIG. 9 is a plan view schematically showing a power conversion device according to the third embodiment of the present disclosure.

A power conversion device 1 according to the third embodiment of the present disclosure will be described. FIG. 9 is a plan view schematically showing the power conversion device 1 according to the third embodiment. In the power conversion device 1 according to the third embodiment, the shapes of the first wiring portion 6 and the second wiring portion 7 are different from those in the first embodiment.

In the first and second embodiments, as an example of the first wiring portion 6 and the second wiring portion 7, the case where the first wiring portion 6 and the second wiring portion 7 have shapes that allow attachment thereof such that the extending direction toward the third peripheral wall 2d side or the fourth peripheral wall 2e side is reversed, is shown in FIG. 1, etc. The shapes of the first wiring portion 6 and the second wiring portion 7 are not limited thereto. As shown in the present embodiment, the shapes of the first wiring portion 6 and the second wiring portion 7 may be left-right symmetric. Even with the left-right symmetric shapes, the same effects as those shown in the first embodiment can be obtained.

One or both of the first wiring portion 6 and the second wiring portion 7 extend toward the third peripheral wall 2d side and the fourth peripheral wall 2e side from the first connection portion 3b or the second connection portion 3c. In the present embodiment, both of the first wiring portion 6 and the second wiring portion 7 extend toward the third peripheral wall 2d side and the fourth peripheral wall 2e side from the first connection portion 3b or the second connection portion 3c, as shown in FIG. 9.

The first wiring portion 6 has, in addition to the configuration of the first wiring portion 6 shown in FIG. 1, an extending portion 6a extending toward the fourth peripheral wall 2e from the first connection portion 3b, and has a through-hole 6b at the end of the extending portion 6a. The second wiring portion 7 has, in addition to the configuration of the second wiring portion 7 shown in FIG. 1, an extending portion 7a extending toward the third peripheral wall 2d from the second connection portion 3c, and has a through-hole 7b at the end of the extending portion 7a.

In the present embodiment, the case where the first wiring portion 6 has the extending portion 6a extending to a position near the fourth peripheral wall 2e from the first connection portion 3b, is shown. However, the present disclosure is not limited thereto. In a case where the first supply portion 4 is located on the fourth peripheral wall 2e side, the first wiring portion 6 may have the extending portion 6a extending to a position near the third peripheral wall 2d from the first connection portion 3b. Similarly, the case where the second wiring portion 7 has the extending portion 7a extending to a position near the third peripheral wall 2d from the second connection portion 3c, is shown. However, the present disclosure is not limited thereto. In a case where the second supply portion 5 is located on the third peripheral wall 2d side, the second wiring portion 7 may have the extending portion 7a extending to a position near the fourth peripheral wall 2e from the second connection portion 3c.

In the present embodiment, the through-holes 6b, 7b are provided at the ends of the extending portion 6a of the first wiring portion 6 and the extending portion 7a of the second wiring portion 7. However, the present disclosure is not limited thereto. The ends of the extending portion 6a and the extending portion 7a may have shapes corresponding to the methods for connection with the first supply portion 4 and the second supply portion 5. For example, screw holes to be fastened from the first supply portion 4 side and the second supply portion 5 side may be provided at the ends of the extending portion 6a and the extending portion 7a.

As described above, in the power conversion device 1 according to the third embodiment, one or both of the first wiring portion 6 and the second wiring portion 7 extend toward the third peripheral wall 2d side and the fourth peripheral wall 2e side from the first connection portion 3b or the second connection portion 3c. Thus, it is possible to adapt to location change of the first supply portion 4 or the second supply portion 5 depending on each vehicle type, without changing the shapes of the first wiring portion 6 and the second wiring portion 7. In addition, since the first wiring portion 6 and the second wiring portion 7 can be shared in common among various vehicle types, the cost of the first wiring portion 6 and the second wiring portion 7 can be reduced. Since the cost of the first wiring portion 6 and the second wiring portion 7 is reduced, the cost of the power conversion device 1 can be reduced. In addition, since the first wiring portion 6 and the second wiring portion 7 can be shared in common, the production volume for the shared common components can be easily increased.

In addition, since the extending portion 6a and the extending portion 7a extend to a position near the third peripheral wall 2d and a position near the fourth peripheral wall 2e, the first connection portion 3b and the second connection portion 3c need not be located at center positions between the third peripheral wall 2d and the fourth peripheral wall 2e. Thus, the degree of freedom in the layout of the first connection portion 3b, the second connection portion 3c, and components of the power conversion circuit 3a can be improved.

Fourth Embodiment

Figure 10:
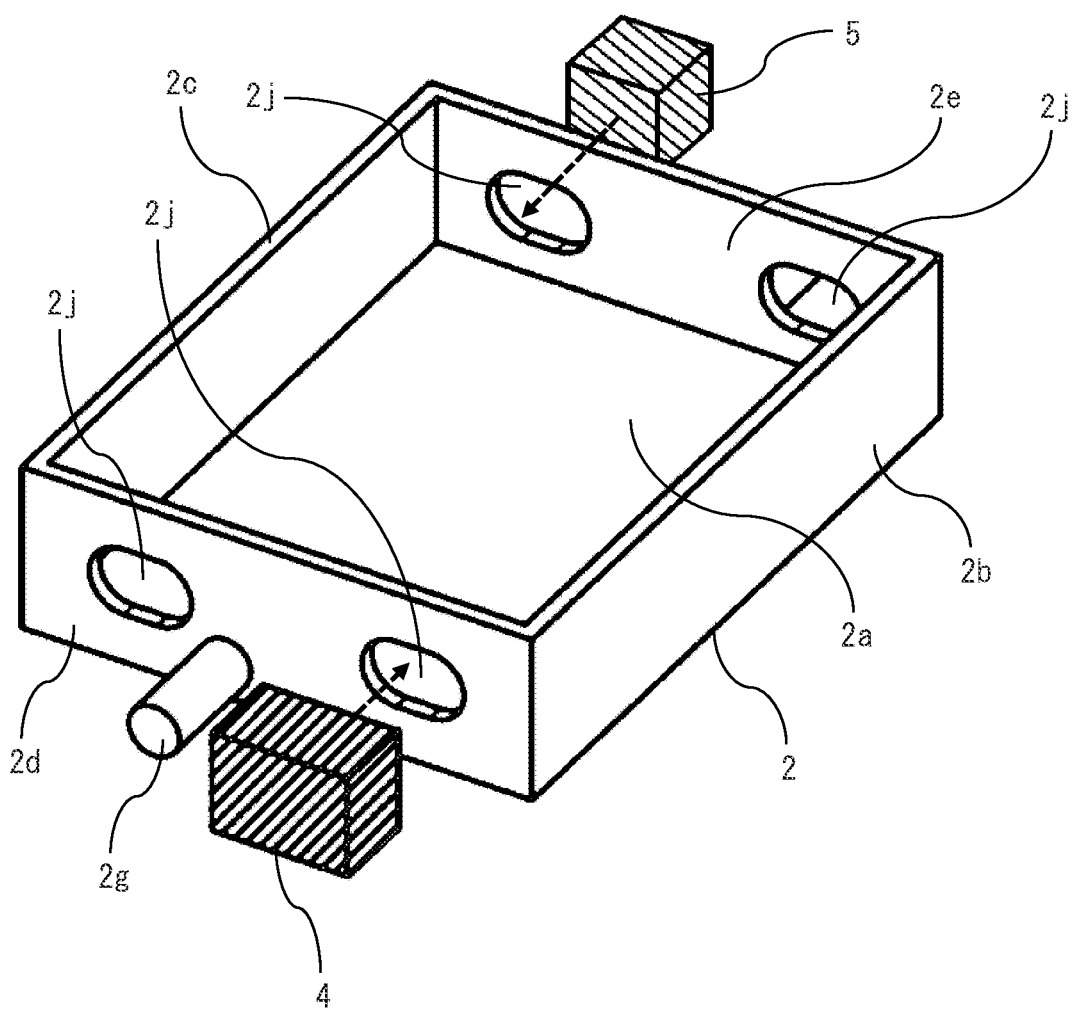
FIG. 10 is a perspective view schematically showing a housing of a power conversion device according to the fourth embodiment of the present disclosure.

A power conversion device 1 according to the fourth embodiment of the present disclosure will be described. FIG. 10 is a perspective view schematically showing the housing 2 of the power conversion device 1 according to the fourth embodiment. In the housing 2 of the power conversion device 1 according to the fourth embodiment, the through-holes 2j are formed in both of the third peripheral wall 2d and the fourth peripheral wall 2e.

The housing 2 has the through-holes 2j in both of the third peripheral wall 2d and the fourth peripheral wall 2e. One or a plurality of through-holes 2j are formed in one peripheral wall. In the present embodiment, two through-holes 2j are provided in the third peripheral wall 2d, and two through-holes 2j are provided in the fourth peripheral wall 2e. The through-holes 2j are provided at the positions of the first supply portion 4 and the second supply portion 5 so as to have shapes corresponding to the shapes of the first supply portion 4 and the second supply portion 5. The first supply portion 4 and the second supply portion 5 are formed by connectors, for example. The connectors penetrate the through-holes 2j in broken-line-arrow directions in FIG. 10 and are fixed to the penetrated walls.

As described above, in the power conversion device 1 according to the fourth embodiment, the housing 2 has the through-holes 2j in both of the third peripheral wall 2d and the fourth peripheral wall 2e. Thus, it is possible to easily adapt to location change of the first supply portion 4 or the second supply portion 5 depending on each vehicle type, without changing the shape of the housing 2. In addition, since the housing 2 can be shared in common among various vehicle types, the cost of the housing 2 can be reduced. Since the cost of the housing 2 is reduced, the cost of the power conversion device 1 can be reduced. In addition, since the housing 2 can be shared in common, the production volume for the shared common housing 2 can be easily increased.

In the present embodiment, the case where the through-holes 2j are provided in both of the third peripheral wall 2d and the fourth peripheral wall 2e, and the first supply portion 4 and the second supply portion 5 are respectively fixed to the third peripheral wall 2d and the fourth peripheral wall 2e, is shown. However, the present disclosure is not limited thereto. As described for the location of the first supply portion 4 in the second embodiment, the housing 2 may have the through-holes 2k penetrating the lid wall 2a, and one or both of the first supply portion 4 and the second supply portion 5 may be located at the lid wall 2a while penetrating the through-holes 2k.

Fifth Embodiment

Figure 11:
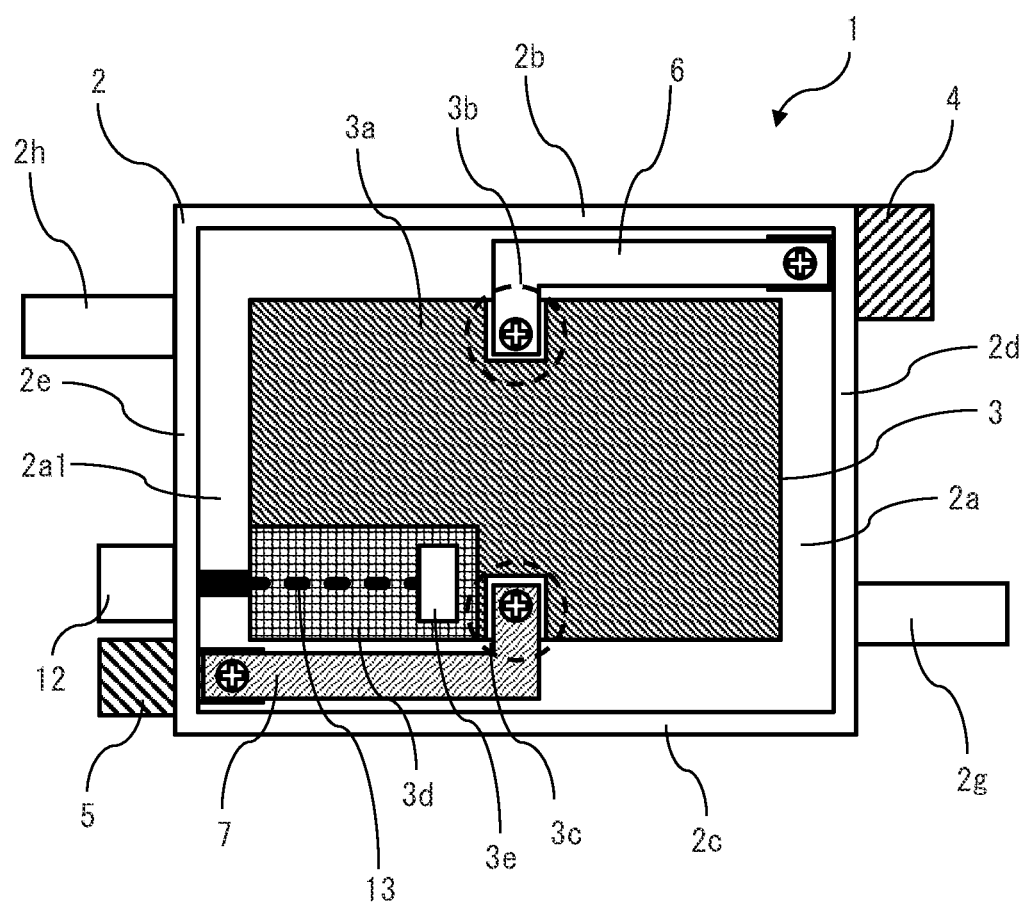
FIG. 11 is a plan view schematically showing a power conversion device according to the fifth embodiment of the present disclosure.

A power conversion device 1 according to the fifth embodiment of the present disclosure will be described. FIG. 11 is a plan view schematically showing the power conversion device 1 according to the fifth embodiment. In the power conversion device 1 according to the fifth embodiment, the power conversion portion 3 includes a control circuit 3d and a control connection portion 3e.

The power conversion portion 3 includes the control circuit 3d for controlling operation of the power conversion circuit 3a, and the control connection portion 3e electrically connecting the control circuit 3d to outside. The power conversion device 1 further includes a control wiring portion 13 electrically connected to the control connection portion 3e, and a third supply portion 12 electrically connected to the control wiring portion 13. The third supply portion 12 supplies a signal from an external device to the control circuit 3d via the control wiring portion 13. On the basis of the supplied signal, the control circuit 3d controls operation of the power conversion circuit 3a.

The control connection portion 3e is located adjacently to the second connection portion 3c, at the end on the second peripheral wall 2c side of the power conversion portion 3. The control connection portion 3e is formed by a connector mounted to a printed board (not shown) or the like provided inside the power conversion portion 3, for example. The third supply portion 12 is located adjacently to the second supply portion 5. In the present embodiment, the second supply portion 5 is provided at the fourth peripheral wall 2e, and therefore the third supply portion 12 is located at the fourth peripheral wall 2e adjacently to the second supply portion 5. The third supply portion 12 is formed such that a metal-plate member (not shown) made of a metal material such as copper having high electrical conductivity is covered with insulating resin, for example.

The control wiring portion 13 is a lead wire formed by coating, with an insulating coat, a metal material such as copper having high electrical conductivity, for example. A connector to be fitted to the connector of the control connection portion 3e is provided at one end of the control wiring portion 13. A press-fit terminal (not shown) to be press-fit joined to the metal-plate member of the third supply portion 12 is provided at another end of the control wiring portion 13. The one end of the control wiring portion 13 is fitted to the connector of the control connection portion 3e, and the other end of the control wiring portion 13 is press-fit joined to the third supply portion 12, whereby the control connection portion 3e and the third supply portion 12 are electrically connected via the control wiring portion 13.

In the present embodiment, the third supply portion 12 is located at the fourth peripheral wall 2e adjacently to the second supply portion 5. However, the location of the third supply portion 12 is not limited thereto. As described for the location of the first supply portion 4 in the second embodiment, the housing 2 may have the through-hole 2k penetrating the lid wall 2a, and the third supply portion 12 may be located at the lid wall 2a adjacently to the fourth peripheral wall 2e while penetrating the through-hole 2k.

In the present embodiment, a connector is provided as the control connection portion 3e, a lead wire is provided as the control wiring portion 13, a connector is provided at one end of the control wiring portion 13, and a press-fit terminal is provided at another end of the control wiring portion 13. However, the present disclosure is not limited thereto. For example, the control connection portion 3e may be formed by a plurality of through-holes at a board, the control wiring portion 13 may be formed by extending the metal-plate member of the third supply portion 12, the extending end of the control wiring portion 13 may be inserted into the through-hole, and both parts may be fixed by soldering.

As described above, in the power conversion device 1 according to the fifth embodiment, the control connection portion 3e is located adjacently to the second connection portion 3c, at the end on the second peripheral wall 2c side of the power conversion portion 3, and the third supply portion 12 is located adjacently to the second supply portion 5. Thus, even in a case where the location of the third supply portion 12 needs to be changed depending on each vehicle type, it is possible to share expensive large-sized components in common among various vehicle types without changing the shape of the power conversion portion 3 which is an expensive large-sized component, whereby the component cost can be reduced. Since the component cost is reduced, the cost of the power conversion device 1 can be reduced. In addition, since specifications of the power conversion portion 3 which is an expensive large-sized component are not changed, the production volume for expensive large-sized components can be easily increased.

In the present embodiment, the power conversion portion 3 is a DC-DC converter for converting DC power. The DC-DC converter is connected to a low-voltage battery (e.g., 12 V) which is an external device via the second supply portion 5. Therefore, the second connection portion 3c, the second supply portion 5, and the second wiring portion 7 are in a low-voltage system. The control wiring portion 13 which is also in a low-voltage system is located on the second connection portion 3c side, instead of the first connection portion 3b side in a high-voltage system. Thus, distances between components, e.g., between the second connection portion 3c and the control connection portion 3e, between the second wiring portion 7 and the control wiring portion 13, and between the second supply portion 5 and the third supply portion 12, are reduced, whereby the size of the power conversion device 1 can be reduced.

Sixth Embodiment

Figure 12:
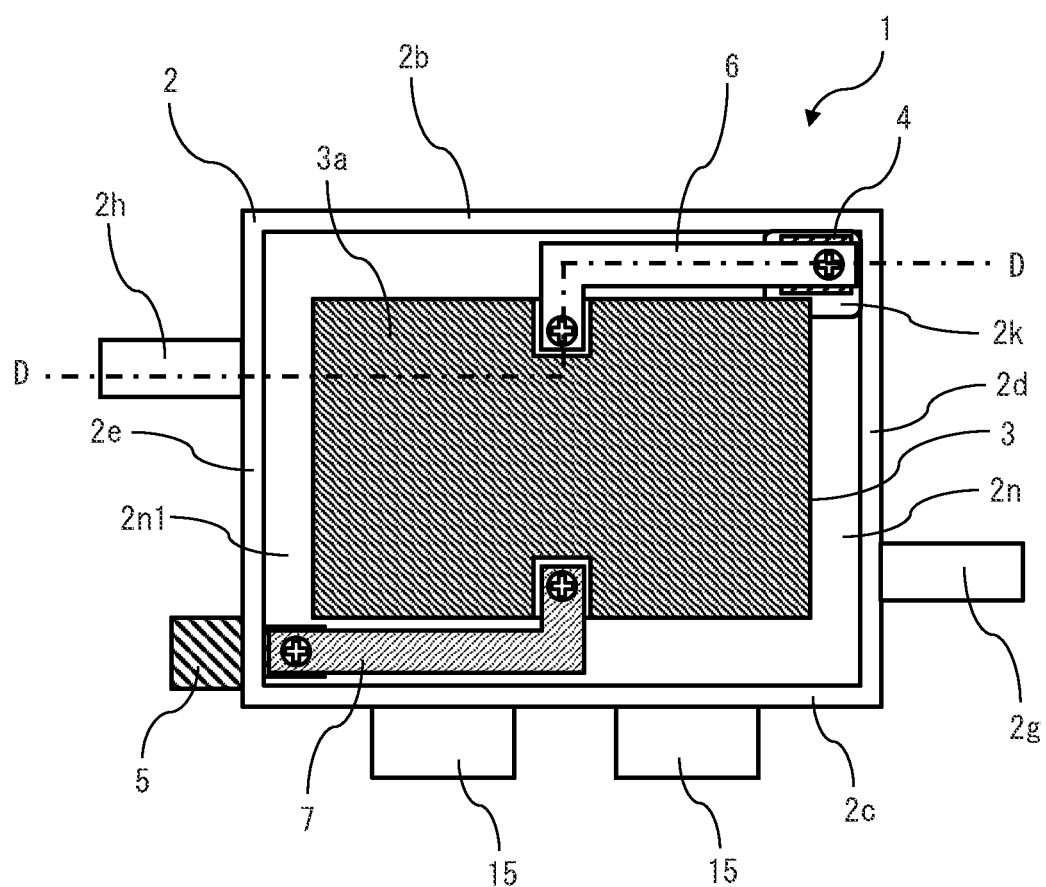
FIG. 12 is a plan view schematically showing a power conversion device according to the sixth embodiment of the present disclosure.
Figure 13:
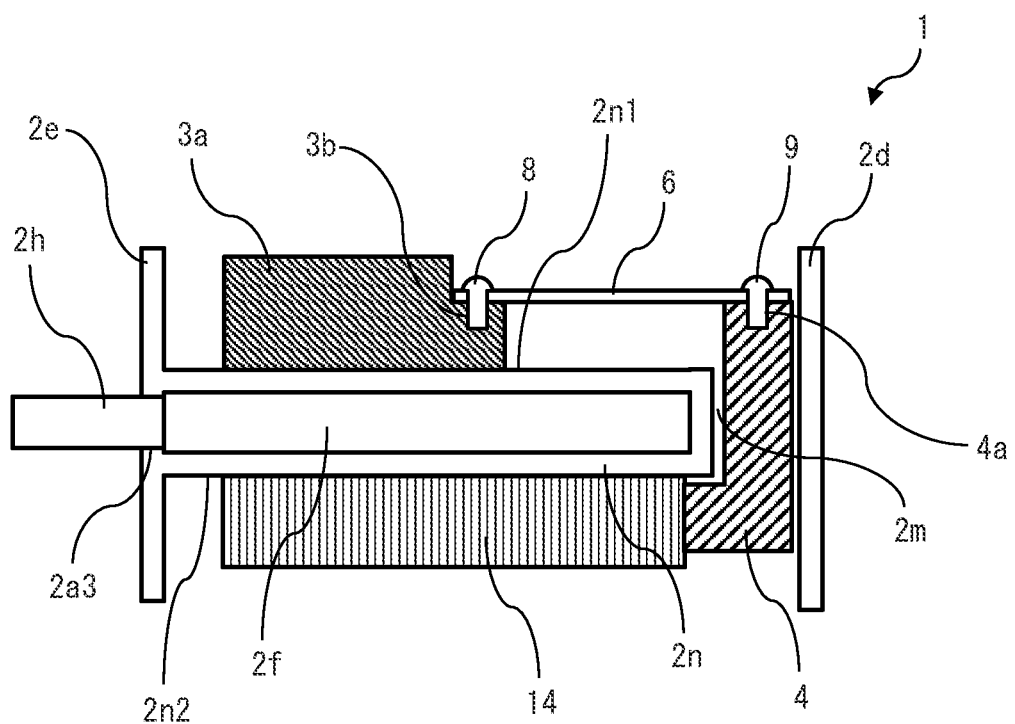
FIG. 13 is a sectional view of the power conversion device taken at a D-D cross-section position in FIG. 12.

A power conversion device 1 according to the sixth embodiment of the present disclosure will be described. FIG. 12 is a plan view schematically showing the power conversion device 1 according to the sixth embodiment. FIG. 13 is a sectional view of the power conversion device 1 taken at a D-D cross-section position in FIG. 12. FIGS. 14 to 20 are plan views schematically showing other power conversion devices 1 according to the sixth embodiment. The power conversion device 1 according to the sixth embodiment further includes an additional power conversion portion 14.

The power conversion device 1 further includes the additional power conversion portion 14 which includes a power conversion circuit (not shown) for converting power and is electrically connected to the power conversion portion 3. The housing 2 has a partition wall 2n partitioning one opening side and another opening side of the four peripheral walls. The power conversion portion 3 is fixed to a surface on the one opening side of the partition wall 2n, and the additional power conversion portion 14 is fixed to a surface on the other opening side of the partition wall 2n. The surface of the partition wall 2n to which the power conversion portion 3 is fixed is defined as a first cooling surface 2n1, and the surface of the partition wall 2n to which the additional power conversion portion 14 is fixed is defined as a second cooling surface 2n2.

With this configuration, even if the additional power conversion portion 14 is further provided to the power conversion device 1, it is possible to share expensive large-sized components in common among various vehicle types without changing the shape of the power conversion portion 3 which is an expensive large-sized component, whereby the component cost can be reduced. Since the component cost is reduced, the cost of the power conversion device 1 can be reduced. In addition, since specifications of the power conversion portion 3 which is an expensive large-sized component are not changed, the production volume for expensive large-sized components can be easily increased. In addition, the size of the power conversion device 1 can be reduced.

The partition wall 2n has at least one penetration portion penetrating the partition wall 2n, and one or both of the first supply portion 4 and the second supply portion 5 penetrate the penetration portions. In the present embodiment, as shown in FIG. 13, the partition wall 2n has a penetration portion 2m, and the first supply portion 4 penetrates the penetration portion 2m so as to protrude toward the side where the power conversion portion 3 is provided from the side where the additional power conversion portion 14 is provided. The first supply portion 4 may be located while penetrating the penetration portion 2m as described above, as long as the first supply portion 4 is located adjacently to the end on the first peripheral wall 2b side of the third peripheral wall 2d. The first supply portion 4 forms a part electrically connecting the power conversion portion 3 and the additional power conversion portion 14. With the first supply portion 4 configured as described above, the number of location patterns for the first supply portion 4 can be increased. In addition, since the first supply portion 4 is located while penetrating the penetration portion 2m, the first supply portion 4 is stored inside the housing 2, whereby the size of the power conversion device 1 can be reduced.

In the present embodiment, the first supply portion 4 is provided so as to extend from the additional power conversion portion 14. The first supply portion 4 is formed such that a metal-plate member (not shown) made of a metal material such as copper having high electrical conductivity is covered with insulating resin, for example. The screw hole 4a is provided at an end of the first supply portion 4. One end of the first supply portion 4 is electrically connected to the additional power conversion portion 14, and another end is electrically connected to the first wiring portion 6. The first supply portion 4 is not limited to the form of extending from the additional power conversion portion 14, and the first supply portion 4 and the additional power conversion portion 14 may be formed as separate bodies. Since the first supply portion 4 electrically connecting the power conversion portion 3 and the additional power conversion portion 14 is formed so as to extend from the additional power conversion portion 14, an additional connection member for connecting the first supply portion 4 and the additional power conversion portion 14 is not needed, and therefore the cost of the power conversion device 1 can be reduced. In addition, since a space for providing such an additional connection member is eliminated, the size of the power conversion device 1 can be reduced.

In the present embodiment, the housing 2 has the coolant path 2f for cooling the power conversion portion 3 and the additional power conversion portion 14, the inlet pipe 2g through which the coolant flows into the coolant path 2f, and the outlet pipe 2h through which the coolant flows out from the coolant path 2f. The coolant path 2f is formed in the partition wall 2n. The power conversion portion 3 and the additional power conversion portion 14 are thermally connected to the partition wall 2n. With this configuration, since the coolant path 2f is formed in the partition wall 2n, the size of the power conversion device 1 does not increase, and both of the power conversion portion 3 and the additional power conversion portion 14 can be efficiently cooled.

The power conversion device 1 further includes fourth supply portions 15 electrically connecting the additional power conversion portion 14 to outside. The fourth supply portions 15 are located at the first peripheral wall 2b or the second peripheral wall 2c on the other opening side. In the present embodiment shown in FIG. 12, the fourth supply portions 15 are located at the second peripheral wall 2c on the other opening side. An external device connected to the fourth supply portions 15 is, for example, a drive motor. The fourth supply portions 15 supply power from the additional power conversion portion 14 to the external device. In addition, the fourth supply portions 15 supply power from the external device to the additional power conversion portion 14.

The fourth supply portions 15 is formed such that a metal-plate member (not shown) made of a metal material such as copper having high electrical conductivity is covered with insulating resin, for example. The fourth supply portions 15 penetrate through-holes provided in the second peripheral wall 2c, and are fixed to the second peripheral wall 2c by fastening members such as screws. The details of the electric-connection method between the additional power conversion portion 14 and the fourth supply portions 15 are omitted.

In such a case where the fourth supply portions 15 are connected to the drive motor, the sizes of the fourth supply portions 15 increase. In a case where the fourth supply portions 15 are located at the first peripheral wall 2b or the second peripheral wall 2c on the other opening side, even if the sizes of the fourth supply portions 15 increase, in the present disclosure, since the first supply portion 4, the second supply portion 5, the inlet pipe 2g, and the outlet pipe 2h are located on the third peripheral wall 2d side or the fourth peripheral wall 2e side, it is possible to flexibly adapt to selection of the locations of the supply portions without influencing the locations of other supply portions and the like.

In the present embodiment, the power conversion portion 3 is a DC-DC converter for converting DC power, and the additional power conversion portion 14 is an inverter for performing conversion between DC power and AC power. The additional power conversion portion 14 is composed of, for example, a switching element, a transformer, a smoothing reactor, a capacitor, and the like. The configurations of the power conversion portion 3 and the additional power conversion portion 14 are not limited thereto. The additional power conversion portion 14 may be a charger for converting commercial AC power to DC power to charge a high-voltage battery, or an inverter for converting DC power from a high-voltage battery to AC power for a motor. The power conversion device 1 can have both of an inverter function and a converter function. In the drawings, locations and shapes of components composing the additional power conversion portion 14 are omitted without being shown.

In a case where the power conversion portion 3 is a DC-DC converter and the additional power conversion portion 14 is an inverter, the sizes of the fourth supply portions 15 increase. Even if the sizes of the fourth supply portions 15 increase, in the present disclosure, since the first supply portion 4, the second supply portion 5, the inlet pipe 2g, and the outlet pipe 2h are located on the third peripheral wall 2d side or the fourth peripheral wall 2e side, it is possible to flexibly adapt to selection of the locations of the supply portions without influencing the locations of other supply portions and the like. In addition, since the fourth supply portions 15 can be located at one of the first peripheral wall 2b or the second peripheral wall 2c on the other opening side, no supply portions are provided at one of the first peripheral wall 2b or the second peripheral wall 2c, and therefore it is possible to provide the peripheral wall where a supply portion, an inlet pipe, and an outlet pipe are not provided in view of the mounting space in the vehicle.

In FIG. 12 in the present embodiment, the first supply portion 4 is located adjacently to the end on the first peripheral wall 2b side of the third peripheral wall 2d, the second supply portion 5 is located adjacently to the end on the second peripheral wall 2c side of the fourth peripheral wall 2e, and the fourth supply portions 15 are located at the second peripheral wall 2c. However, the present disclosure is not limited thereto. The locations of the first supply portion 4, the second supply portion 5, and the fourth supply portions 15 may be as follows.

Figure 14:
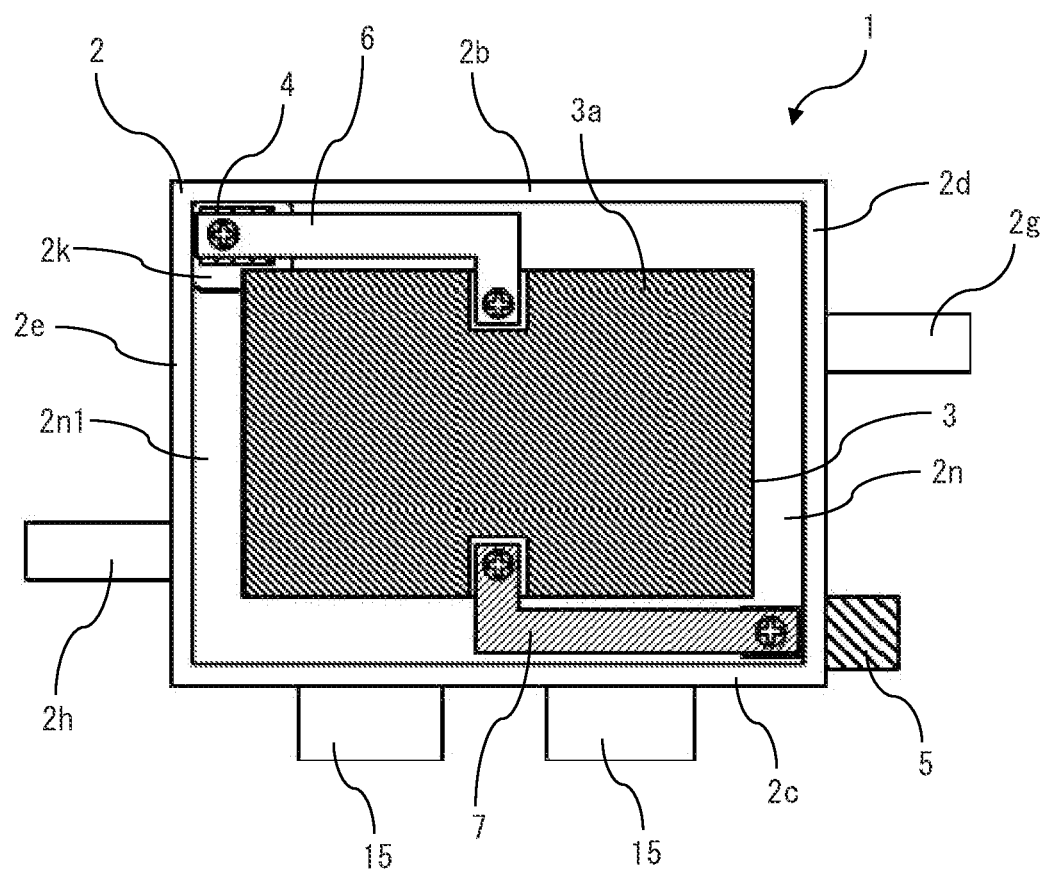
FIG. 14 is a plan view schematically showing another power conversion device according to the sixth embodiment.
Figure 15:
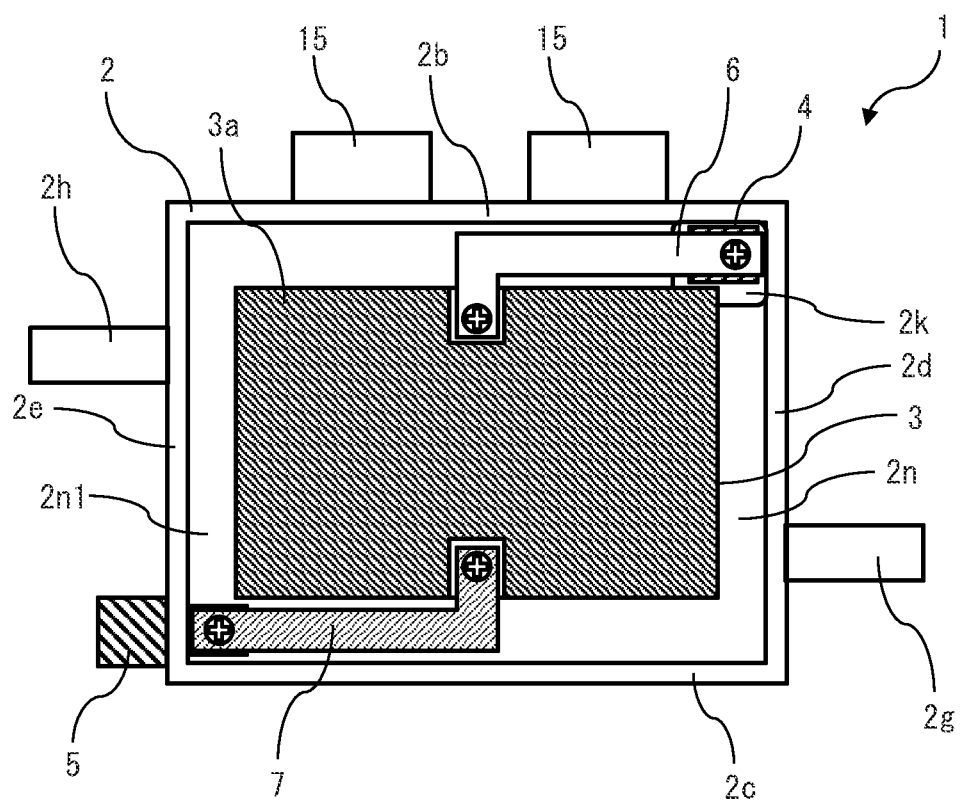
FIG. 15 is a plan view schematically showing another power conversion device according to the sixth embodiment.
Figure 16:
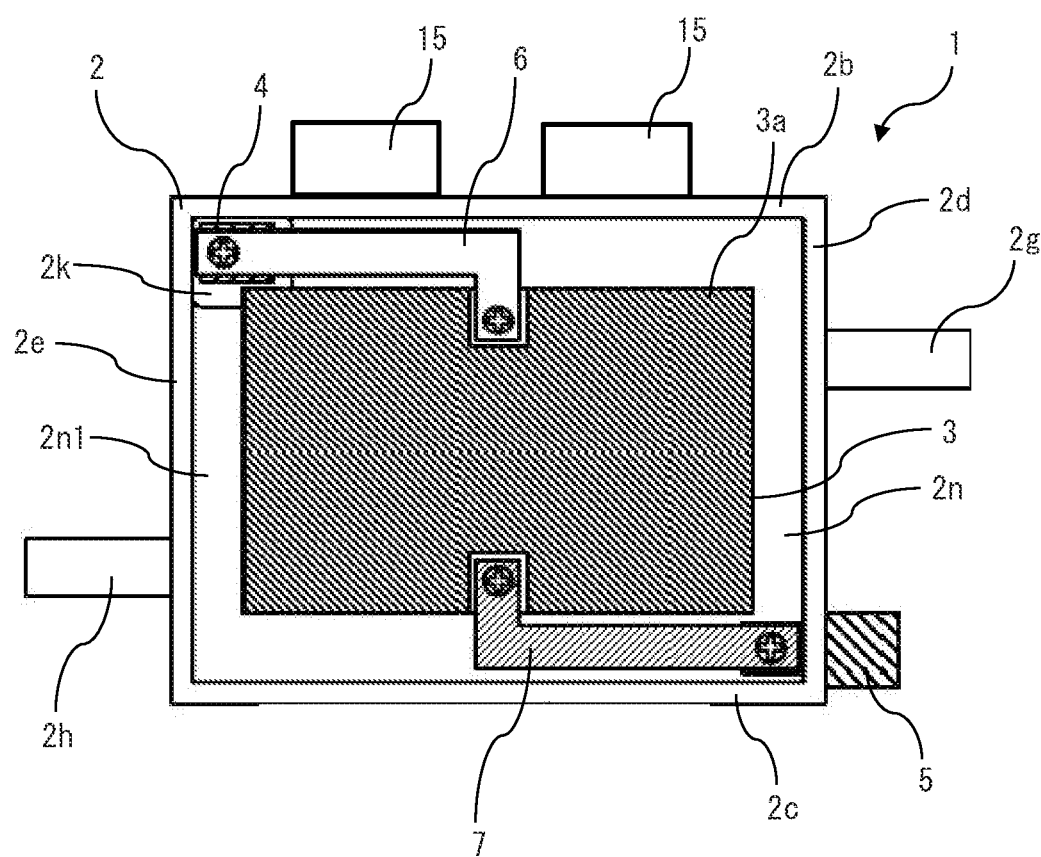
FIG. 16 is a plan view schematically showing another power conversion device according to the sixth embodiment.
Figure 17:
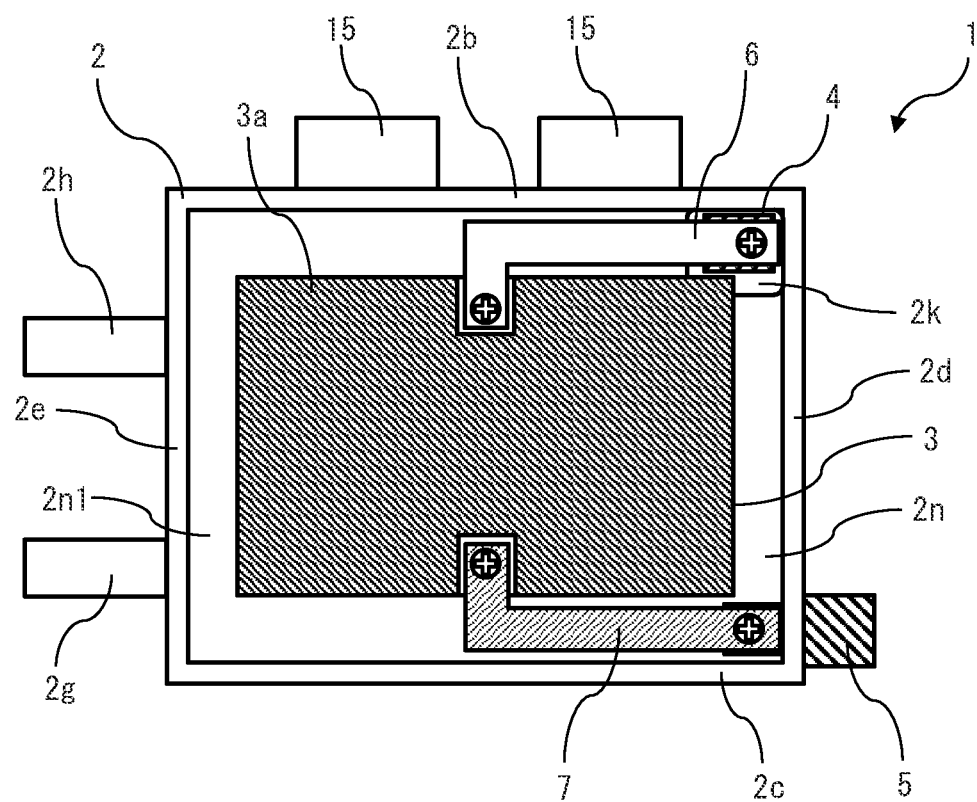
FIG. 17 is a plan view schematically showing another power conversion device according to the sixth embodiment.

In FIG. 14 in the present embodiment, the first supply portion 4 is located adjacently to the end on the first peripheral wall 2b side of the fourth peripheral wall 2e, the second supply portion 5 is located adjacently to the end on the second peripheral wall 2c side of the third peripheral wall 2d, and the fourth supply portions 15 are located at the second peripheral wall 2c. In FIG. 15 in the present embodiment, the first supply portion 4 is located adjacently to the end on the first peripheral wall 2b side of the third peripheral wall 2d, the second supply portion 5 is located adjacently to the end on the second peripheral wall 2c side of the fourth peripheral wall 2e, and the fourth supply portions 15 are located at the first peripheral wall 2b. In FIG. 16 in the present embodiment, the first supply portion 4 is located adjacently to the end on the first peripheral wall 2b side of the fourth peripheral wall 2e, the second supply portion 5 is located adjacently to the end on the second peripheral wall 2c side of the third peripheral wall 2d, and the fourth supply portions 15 are located at the first peripheral wall 2b. In FIG. 17 in the present embodiment, the first supply portion 4 is located adjacently to the end on the first peripheral wall 2b side of the third peripheral wall 2d, the second supply portion 5 is located adjacently to the end on the second peripheral wall 2c side of the third peripheral wall 2d, and the fourth supply portions 15 are located at the first peripheral wall 2b.

Figure 18:
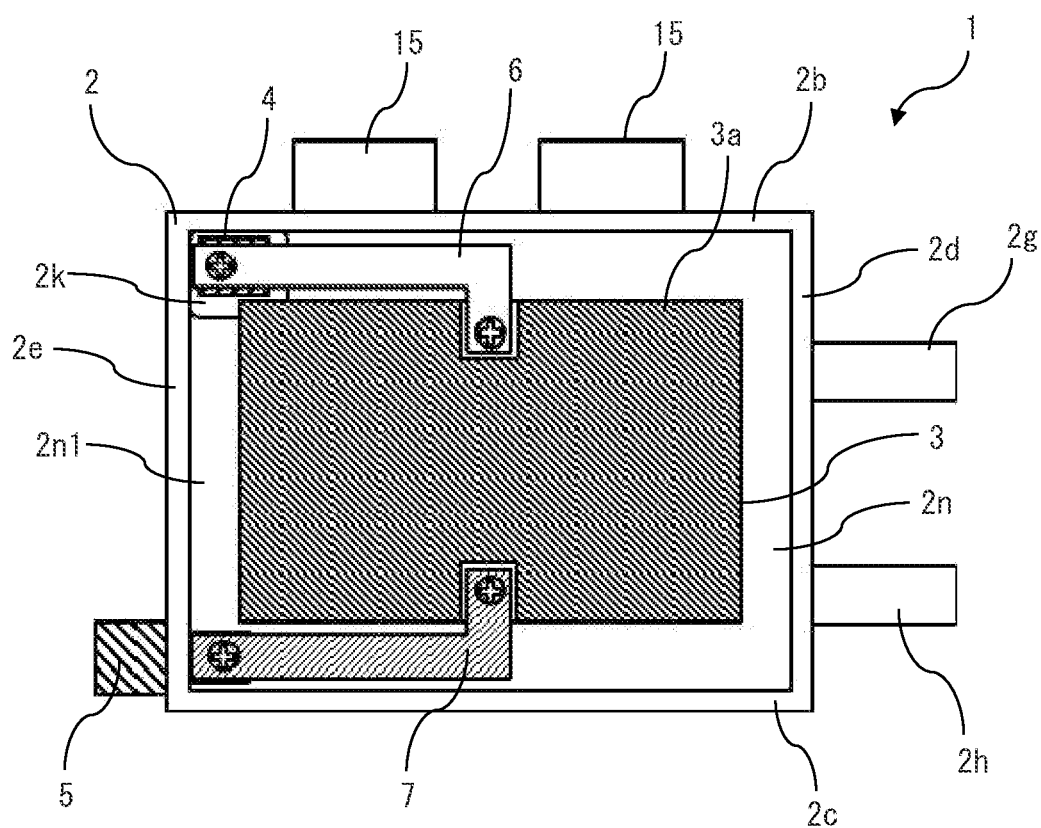
FIG. 18 is a plan view schematically showing another power conversion device according to the sixth embodiment.
Figure 19:
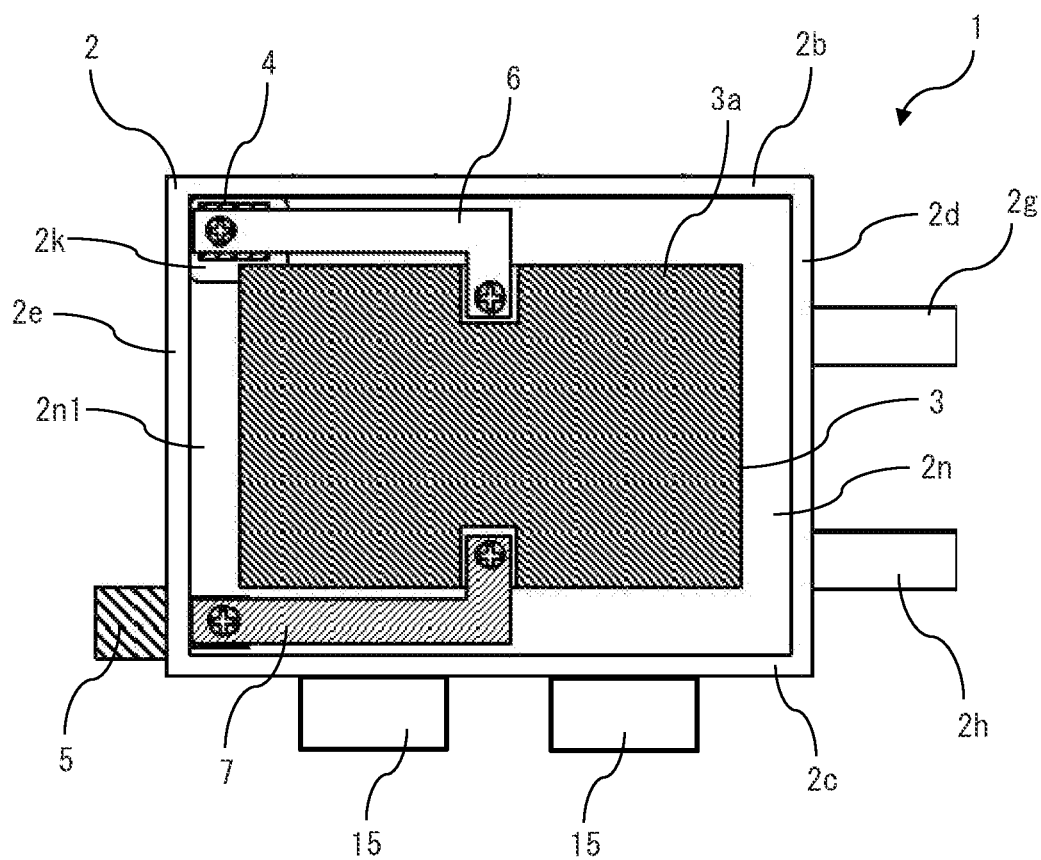
FIG. 19 is a plan view schematically showing another power conversion device according to the sixth embodiment.
Figure 20:
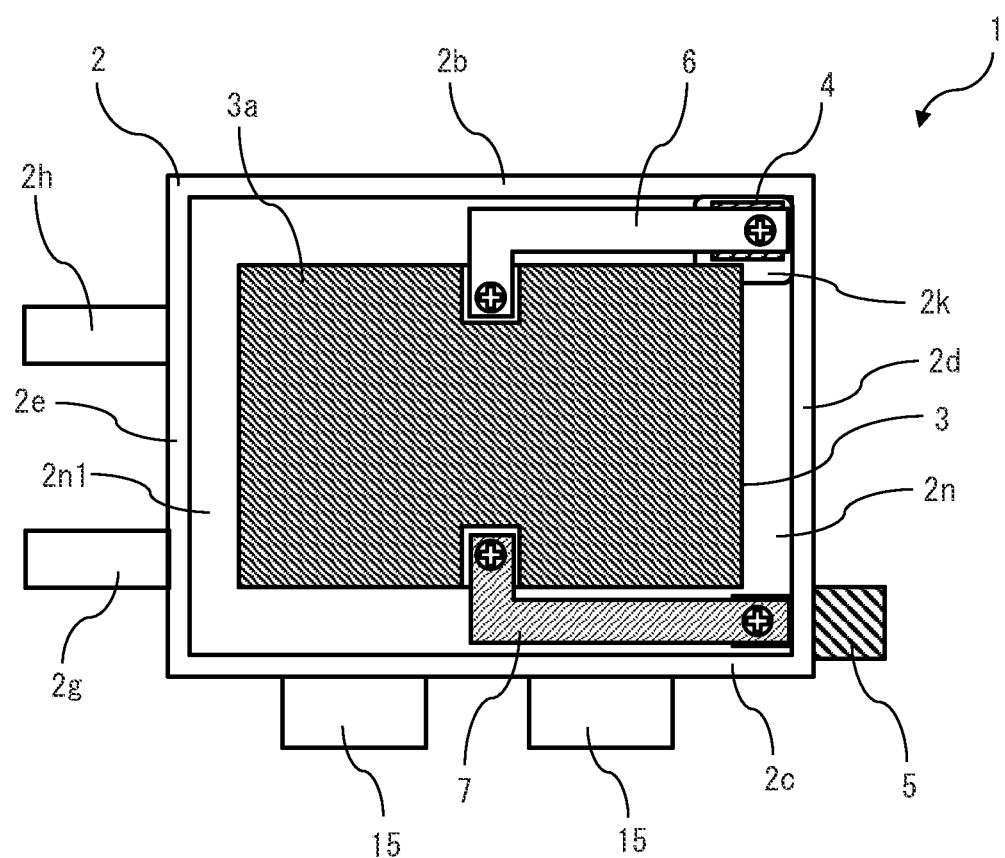
FIG. 20 is a plan view schematically showing another power conversion device according to the sixth embodiment.

In FIG. 18 in the present embodiment, the first supply portion 4 is located adjacently to the end on the first peripheral wall 2b side of the fourth peripheral wall 2e, the second supply portion 5 is located adjacently to the end on the second peripheral wall 2c side of the fourth peripheral wall 2e, and the fourth supply portions 15 are located at the first peripheral wall 2b. In FIG. 19 in the present embodiment, the first supply portion 4 is located adjacently to the end on the first peripheral wall 2b side of the fourth peripheral wall 2e, the second supply portion 5 is located adjacently to the end on the second peripheral wall 2c side of the fourth peripheral wall 2e, and the fourth supply portions 15 are located at the second peripheral wall 2c. In FIG. 20 in the present embodiment, the first supply portion 4 is located adjacently to the end on the first peripheral wall 2b side of the third peripheral wall 2d, the second supply portion 5 is located adjacently to the end on the second peripheral wall 2c side of the third peripheral wall 2d, and the fourth supply portions 15 are located at the second peripheral wall 2c.

As described above, the power conversion device 1 according to the sixth embodiment further includes the additional power conversion portion 14 electrically connected to the power conversion portion 3, the housing 2 has the partition wall 2*n* partitioning the one opening side and the other opening side of the four peripheral walls, the power conversion portion 3 is fixed to the surface on the one opening side of the partition wall 2*n*, and the additional power conversion portion 14 is fixed to the surface on the other opening side of the partition wall 2*n*. Thus, even if the additional power conversion portion 14 is further provided to the power conversion device 1, it is possible to share expensive large-sized components in common among various vehicle types without changing the shape of the power conversion portion 3 which is an expensive large-sized component, whereby the component cost can be reduced. Since the component cost is reduced, the cost of the power conversion device 1 can be reduced. In addition, since specifications of the power conversion portion 3 which is an expensive large-sized component are not changed, the production volume for expensive large-sized components can be easily increased.

In a power conversion device in which a plurality of power conversion portions are integrated, the number of supply portions such as connectors increases, and various supply portions and inlet and outlet pipes for a cooling fluid need to be located in a limited space. Thus, flexibility is highly required. With the configuration according to the present disclosure, it is possible to flexibly adapt to selection of the locations of the supply portions without influencing the locations of other supply portions and the like.

The partition wall 2*n* may have at least one penetration portion penetrating the partition wall 2*n*, and one or both of the first supply portion 4 and the second supply portion 5 may penetrate the penetration portions. Thus, the number of location patterns for the first supply portion 4 can be increased. In addition, since the first supply portion 4 is located while penetrating the penetration portion 2*m*, the first supply portion 4 is stored inside the housing 2, whereby the size of the power conversion device 1 can be reduced.

The first supply portion 4 may be provided so as to extend from the additional power conversion portion 14. Thus, an additional connection member for connecting the first supply portion 4 and the additional power conversion portion 14 is not needed, and therefore the cost of the power conversion device 1 can be reduced. In addition, since a space for providing such an additional connection member is eliminated, the size of the power conversion device 1 can be reduced.

The housing 2 may have the coolant path 2*f* for cooling the power conversion portion 3 and the additional power conversion portion 14, the inlet pipe 2*g* through which the coolant flows into the coolant path 2*f*, and the outlet pipe 2*h* through which the coolant flows out from the coolant path 2*f*, the coolant path 2*f* may be formed in the partition wall 2*n*, and the power conversion portion 3 and the additional power conversion portion 14 may be thermally connected to the partition wall 2*n*. Thus, since the coolant path 2*f* is formed in the partition wall 2*n*, the size of the power conversion device 1 does not increase, and both of the power conversion portion 3 and the additional power conversion portion 14 can be efficiently cooled.

The power conversion device 1 may further include the fourth supply portions 15 electrically connecting the additional power conversion portion 14 to outside, and the fourth supply portions 15 may be located on the first peripheral wall 2*b* or the second peripheral wall 2*c* on the other opening side. In such a case where the fourth supply portions 15 are connected to a drive motor, even if the sizes of the fourth supply portions 15 increase, in the present disclosure, since the first supply portion 4, the second supply portion 5, the inlet pipe 2*g*, and the outlet pipe 2*h* are located on the third peripheral wall 2*d* side or the fourth peripheral wall 2*e* side, it is possible to flexibly adapt to selection of the locations of the supply portions without influencing the locations of other supply portions and the like.

The power conversion portion 3 may be a DC-DC converter for converting DC power, and the additional power conversion portion 14 may be an inverter for performing conversion between DC power and AC power. Thus, even if the sizes of the fourth supply portion 15 increase, in the present disclosure, since the first supply portion 4, the second supply portion 5, the inlet pipe 2*g*, and the outlet pipe 2*h* are located on the third peripheral wall 2*d* side or the fourth peripheral wall 2*e* side, it is possible to flexibly adapt to selection of the locations of the supply portions without influencing the locations of other supply portions and the like. In addition, since the fourth supply portions 15 can be located at one of the first peripheral wall 2*b* or the second peripheral wall 2*c* on the other opening side, no supply portions are provided at one of the first peripheral wall 2*b* or the second peripheral wall 2*c*, and therefore it is possible to provide the peripheral wall where a supply portion, an inlet pipe, and an outlet pipe are not provided in view of the mounting space in the vehicle.

Seventh Embodiment

Figure 21:
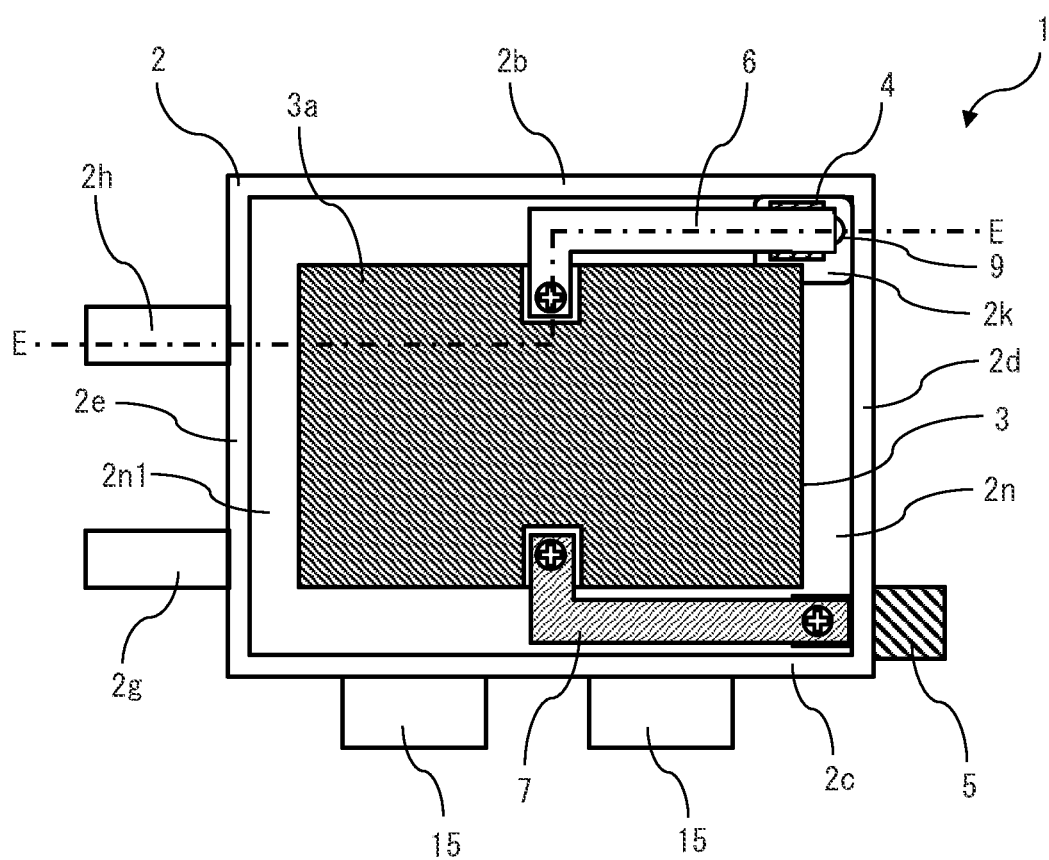
FIG. 21 is a plan view schematically showing a power conversion device according to the seventh embodiment of the present disclosure.
Figure 22:
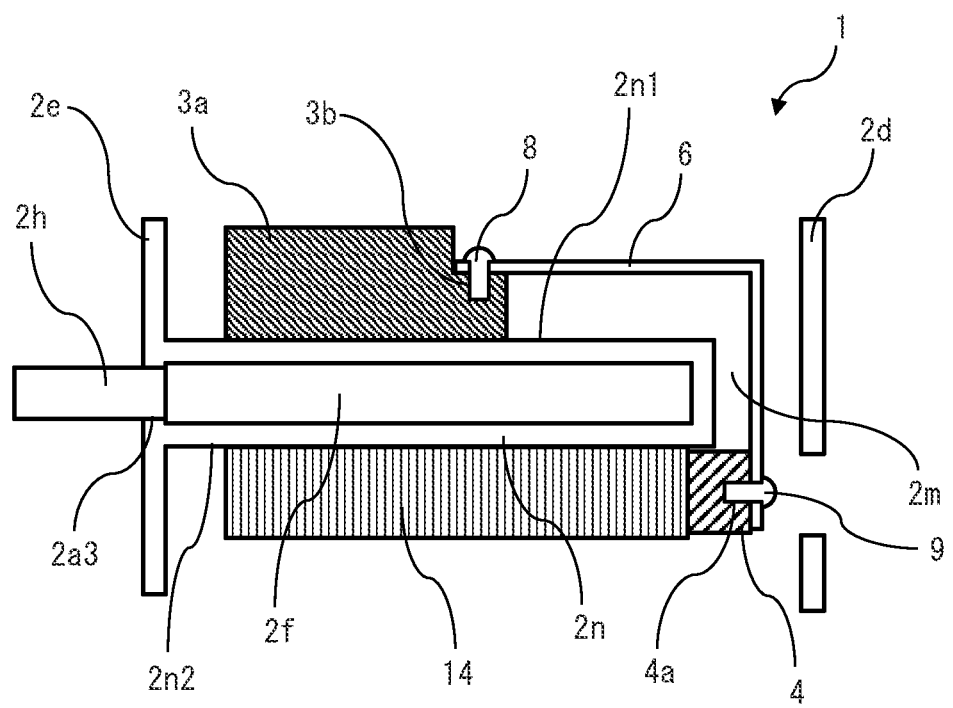
FIG. 22 is a sectional view of the power conversion device taken at an E-E cross-section position in FIG. 21.

A power conversion device 1 according to the seventh embodiment of the present disclosure will be described. FIG. 21 is a plan view schematically showing the power conversion device 1 according to the seventh embodiment. FIG. 22 is a sectional view of the power conversion device 1 taken at an E-E cross-section position in FIG. 21. In the power conversion device 1 according to the seventh embodiment, the shape of the first wiring portion 6 is different from that in the sixth embodiment.

As shown in FIG. 22, the partition wall 2*n* has the penetration portion 2*m* penetrating the partition wall 2*n*, and the first supply portion 4 is provided adjacently to the penetration portion 2*m* so as to extend from the additional power conversion portion 14. The first wiring portion 6 penetrates the penetration portion 2*m* and is electrically connected to the first supply portion 4.

The first supply portion 4 has the screw hole 4*a*. The first supply portion 4 is provided in a state in which the screw hole 4*a* is located on the additional power conversion portion 14 side. The first wiring portion 6 is bent on the first cooling surface 2*n*1 side, and then penetrates the penetration portion 2*m* so as to extend toward the additional power conversion portion 14 side. The first wiring portion 6 is fixed to the screw hole 4*a* provided to the first supply portion 4, by the screw 9. The screw 9 is fastened to the screw hole 4*a*, using a through-hole provided in the third peripheral wall 2*d*. The first wiring portion 6 is electrically connected to the additional power conversion portion 14 via the first supply portion 4.

As described above, in the power conversion device 1 according to the seventh embodiment, the first supply portion 4 is provided adjacently to the penetration portion 2*m* so as to extend from the additional power conversion portion 14, and the first wiring portion 6 penetrates the penetration portion 2*m* and is electrically connected to the first supply portion 4. Thus, the part connecting the power conversion portion 3 and the additional power conversion portion 14 is stored inside the housing 2, whereby the size of the power conversion device 1 can be reduced.

Figure 26:
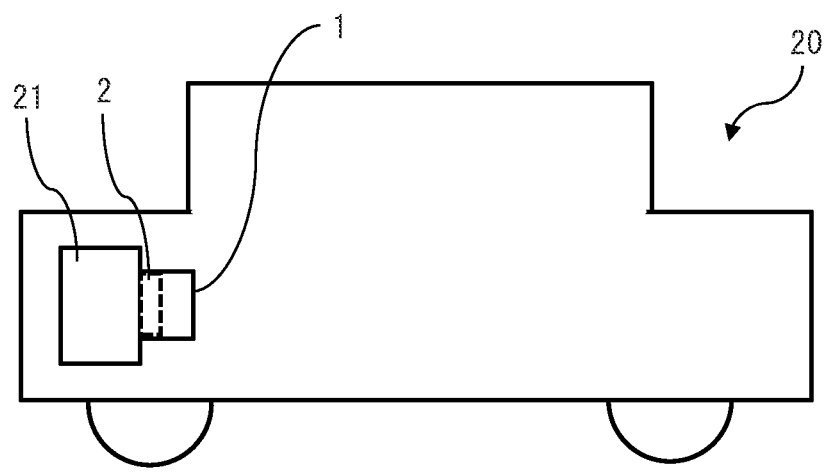
FIG. 26 shows an example of a mounted state of the power conversion device according to the present disclosure.

As shown in FIG. 26, the power conversion device 1 according to the present disclosure is used by being mounted to a vehicle 20, for example. FIG. 26 shows an example of a mounted state of the power conversion device 1 according to the present disclosure. The housing 2 of the power conversion device 1 is fixed to the vehicle 20. In FIG. 26, the housing 2 is a part shown by a broken line. A part of the vehicle 20 to which the housing 2 is fixed is, for example, a drive motor 21. With the power conversion device 1 configured as described above, it is possible to mount the cost-reduced power conversion device 1 also in the vehicle 20 for which cost reduction is severely required. In addition, with the power conversion device 1 according to the present disclosure, it is possible to provide the peripheral wall where a supply portion, an inlet pipe, and an outlet pipe are not provided, and therefore, the power conversion device 1 can be easily fixed to the vehicle 20 at the peripheral wall where a supply portion, an inlet pipe, and an outlet pipe are not provided.

Although the disclosure is described above in terms of various exemplary embodiments and implementations, it should be understood that the various features, aspects, and functionality described in one or more of the individual embodiments are not limited in their applicability to the particular embodiment with which they are described, but instead can be applied, alone or in various combinations to one or more of the embodiments of the disclosure.

It is therefore understood that numerous modifications which have not been exemplified can be devised without departing from the scope of the present disclosure. For example, at least one of the constituent components may be modified, added, or eliminated. At least one of the constituent components mentioned in at least one of the preferred embodiments may be selected and combined with the constituent components mentioned in another preferred embodiment.

Hereinafter, modes of the present disclosure are summarized as additional notes.

Additional Note 1

A power conversion device comprising:
a power conversion portion including a power conversion circuit for converting power, and a first connection portion and a second connection portion electrically connecting the power conversion circuit to outside;
a first wiring portion electrically connected to the first connection portion;
a second wiring portion electrically connected to the second connection portion;
a first supply portion electrically connected to the first wiring portion;
a second supply portion electrically connected to the second wiring portion; and
a housing storing the power conversion portion, the first wiring portion, and the second wiring portion, and having four peripheral walls in a rectangular tube shape, wherein
the four peripheral walls are a first peripheral wall, a second peripheral wall opposed to the first peripheral wall, a third peripheral wall, and a fourth peripheral wall opposed to the third peripheral wall,
the first connection portion is provided at an end on the first peripheral wall side of the power conversion portion,
the second connection portion is provided at an end on the second peripheral wall side of the power conversion portion,
the first supply portion is located adjacently to an end on the first peripheral wall side of the third peripheral wall or the fourth peripheral wall,
the second supply portion is located adjacently to an end on the second peripheral wall side of the third peripheral wall or the fourth peripheral wall,
the first wiring portion extends along the first peripheral wall, between the first connection portion and the first supply portion, and
the second wiring portion extends along the second peripheral wall, between the second connection portion and the second supply portion.

Additional Note 2

The power conversion device according to additional note 1, wherein
one or both of the first connection portion and the second connection portion are located at center positions between the third peripheral wall and the fourth peripheral wall.

Additional Note 3

The power conversion device according to additional note 2, wherein
one or both of the first wiring portion and the second wiring portion have shapes that allow attachment thereof such that an extending direction toward the third peripheral wall side or the fourth peripheral wall side is reversed.

Additional Note 4

The power conversion device according to additional note 1 or 2, wherein
one or both of the first wiring portion and the second wiring portion extend toward the third peripheral wall side and the fourth peripheral wall side from the first connection portion or the second connection portion.

Additional Note 5

The power conversion device according to any one of additional notes 1 to 4, wherein
the first supply portion and the second supply portion are formed by connectors, and
the connectors are fixed to the four peripheral walls or a lid wall covering an opening of the four peripheral walls.

Additional Note 6

The power conversion device according to additional note 5, wherein
the housing has through-holes in both of the third peripheral wall and the fourth peripheral wall, and
the connectors penetrate the through-holes and are fixed to penetrated walls.

Additional Note 7

The power conversion device according to any one of additional notes 1 to 6, wherein the power conversion portion includes a control circuit for controlling operation of the power conversion circuit, and a control connection portion electrically connecting the control circuit to outside, the power conversion device further comprises a control wiring portion electrically connected to the control connection portion, and a third supply portion electrically connected to the control wiring portion, the control connection portion is located adjacently to the second connection portion, at the end on the second peripheral wall side of the power conversion portion, and the third supply portion is located adjacently to the second supply portion.

Additional Note 8

The power conversion device according to any one of additional notes 1 to 7, wherein
the housing has a coolant path for cooling the power conversion portion, an inlet pipe through which a coolant flows into the coolant path, and an outlet pipe through which the coolant flows out from the coolant path,
the power conversion portion is thermally connected to the housing, and
at least one of the inlet pipe and the outlet pipe is located on the third peripheral wall side or the fourth peripheral wall side.

Additional Note 9

The power conversion device according to any one of additional notes 1 to 4, further comprising an additional power conversion portion which includes a power conversion circuit for converting power and is electrically connected to the power conversion portion, wherein
the housing has a partition wall partitioning one opening side and another opening side of the four peripheral walls, and
the power conversion portion is fixed to a surface on the one opening side of the partition wall, and the additional power conversion portion is fixed to a surface on the other opening side of the partition wall.

Additional Note 10

The power conversion device according to additional note 9, wherein
the partition wall has at least one penetration portion penetrating the partition wall, and
one or both of the first supply portion and the second supply portion penetrate the penetration portions.

Additional Note 11

The power conversion device according to additional note 10, wherein
the first supply portion is provided so as to extend from the additional power conversion portion.

Additional Note 12

The power conversion device according to additional note 9, wherein
the partition wall has a penetration portion penetrating the partition wall,
the first supply portion is provided adjacently to the penetration portion so as to extend from the additional power conversion portion, and
the first wiring portion penetrates the penetration portion and is electrically connected to the first supply portion.

Additional Note 13

The power conversion device according to any one of additional notes 9 to 12, wherein
the housing has a coolant path for cooling the power conversion portion and the additional power conversion portion, an inlet pipe through which a coolant flows into the coolant path, and an outlet pipe through which the coolant flows out from the coolant path,
the coolant path is formed in the partition wall, and
the power conversion portion and the additional power conversion portion are thermally connected to the partition wall.

Additional Note 14

The power conversion device according to any one of additional notes 9 to 13, further comprising a fourth supply portion electrically connecting the additional power conversion portion to outside, wherein
the fourth supply portion is located at the first peripheral wall or the second peripheral wall on the other opening side.

Additional Note 15

The power conversion device according to additional note 1, wherein
the power conversion portion is a DC-DC converter for converting DC power.

Additional Note 16

The power conversion device according to any one of additional notes 9 to 14, wherein
the power conversion portion is a DC-DC converter for converting DC power, and
the additional power conversion portion is an inverter for performing conversion between DC power and AC power.

Additional Note 17

The power conversion device according to any one of additional notes 1 to 16, wherein
the housing is fixed to a vehicle.

DESCRIPTION OF THE REFERENCE CHARACTERS 1 power conversion device
2 housing
2a lid wall
2a1 cooling surface
2a2 inlet pipe through-hole
2a3 outlet pipe through-hole
2b first peripheral wall
2c second peripheral wall
2d third peripheral wall
2e fourth peripheral wall
2f coolant path 2g inlet pipe
2h outlet pipe
2j through-hole
2k through-hole
2m penetration portion
2n partition wall
2n1 first cooling surface
2n2 second cooling surface
3 power conversion portion
3a power conversion circuit
3b first connection portion
3c second connection portion
3d control circuit
3e control connection portion
4 first supply portion
4a screw hole
5 second supply portion
5a screw hole
6 first wiring portion
6a extending portion
6b through-hole
7 second wiring portion
7a extending portion
7b through-hole
8, 9, 10, 11 screw
12 third supply portion
13 control wiring portion
14 additional power conversion portion
15 fourth supply portion
20 vehicle
21 drive motor
100 power conversion device
101 cooling block
102 input filter
103 power module
104 transformer
105 choke coil
106 smoothing capacitor
107 component-to-component connection portion
108 input terminal
109 output terminal
110, 111 interface
112, 113 wiring member

What is claimed is:

1. A power conversion device comprising:
a power conversion portion including a power conversion circuit for converting power, and a first connection portion and a second connection portion electrically connecting the power conversion circuit to outside;
a first wiring portion electrically connected to the first connection portion;
a second wiring portion electrically connected to the second connection portion;
a first supply portion electrically connected to the first wiring portion;
a second supply portion electrically connected to the second wiring portion; and
a housing storing the power conversion portion, the first wiring portion, and the second wiring portion, and having four peripheral walls in a rectangular tube shape, wherein
the four peripheral walls are a first peripheral wall, a second peripheral wall opposed to the first peripheral wall, a third peripheral wall, and a fourth peripheral wall opposed to the third peripheral wall,
the first connection portion is provided at an end on a first peripheral wall side of the power conversion portion,
the second connection portion is provided at an end on a second peripheral wall side of the power conversion portion,
the first supply portion is located adjacently to an end on the first peripheral wall side of the third peripheral wall or the fourth peripheral wall,
the second supply portion is located adjacently to an end on the second peripheral wall side of the third peripheral wall or the fourth peripheral wall,
the first wiring portion extends along the first peripheral wall, between the first connection portion and the first supply portion, and
the second wiring portion extends along the second peripheral wall, between the second connection portion and the second supply portion.

2. The power conversion device according to claim 1, wherein
one or both of the first connection portion and the second connection portion are located at center positions between the third peripheral wall and the fourth peripheral wall.

3. The power conversion device according to claim 2, wherein
one or both of the first wiring portion and the second wiring portion have shapes that allow attachment thereof such that an extending direction toward a third peripheral wall side or a fourth peripheral wall side is reversed.

4. The power conversion device according to claim 1, wherein
one or both of the first wiring portion and the second wiring portion extend toward a third peripheral wall side and a fourth peripheral wall side from the first connection portion or the second connection portion.

5. The power conversion device according to claim 1, wherein
the first supply portion and the second supply portion are formed by connectors, and
the connectors are fixed to the four peripheral walls or a lid wall covering an opening of the four peripheral walls.

6. The power conversion device according to claim 5, wherein
the housing has through-holes in both of the third peripheral wall and the fourth peripheral wall, and
the connectors penetrate the through-holes and are fixed to penetrated walls.

7. The power conversion device according to claim 1, wherein
the power conversion portion includes a control circuit for controlling operation of the power conversion circuit, and a control connection portion electrically connecting the control circuit to outside,
the power conversion device further comprises a control wiring portion electrically connected to the control connection portion, and a third supply portion electrically connected to the control wiring portion,
the control connection portion is located adjacently to the second connection portion, at the end on the second peripheral wall side of the power conversion portion, and
the third supply portion is located adjacently to the second supply portion.

8. The power conversion device according to claim 1, wherein
the housing has a coolant path for cooling the power conversion portion, an inlet pipe through which a coolant flows into the coolant path, and an outlet pipe through which the coolant flows out from the coolant path, the power conversion portion is thermally connected to the housing, and at least one of the inlet pipe and the outlet pipe is located on a third peripheral wall side or a fourth peripheral wall side.

9. The power conversion device according to claim 1, further comprising an additional power conversion portion which includes a power conversion circuit for converting power and is electrically connected to the power conversion portion, wherein the housing has a partition wall partitioning one opening side and another opening side of the four peripheral walls, and the power conversion portion is fixed to a surface on the one opening side of the partition wall, and the additional power conversion portion is fixed to a surface on the other opening side of the partition wall.

10. The power conversion device according to claim 9, wherein the partition wall has at least one penetration portion penetrating the partition wall, and one or both of the first supply portion and the second supply portion penetrate the penetration portions.

11. The power conversion device according to claim 10, wherein the first supply portion is provided so as to extend from the additional power conversion portion.

12. The power conversion device according to claim 9, wherein the partition wall has a penetration portion penetrating the partition wall, the first supply portion is provided adjacently to the penetration portion so as to extend from the additional power conversion portion, and the first wiring portion penetrates the penetration portion and is electrically connected to the first supply portion.

13. The power conversion device according to claim 9, wherein the housing has a coolant path for cooling the power conversion portion and the additional power conversion portion, an inlet pipe through which a coolant flows into the coolant path, and an outlet pipe through which the coolant flows out from the coolant path, the coolant path is formed in the partition wall, and the power conversion portion and the additional power conversion portion are thermally connected to the partition wall.

14. The power conversion device according to claim 9, further comprising a fourth supply portion electrically connecting the additional power conversion portion to outside, wherein the fourth supply portion is located at the first peripheral wall or the second peripheral wall on the other opening side.

15. The power conversion device according to claim 1, wherein the power conversion portion is a DC-DC converter for converting DC power.

16. The power conversion device according to claim 14, wherein the power conversion portion is a DC-DC converter for converting DC power, and the additional power conversion portion is an inverter for performing conversion between DC power and AC power.

17. The power conversion device according to claim 1, wherein the housing is fixed to a vehicle.

* * * * *